(12) United States Patent
Andrews et al.

(10) Patent No.: US 10,713,400 B2
(45) Date of Patent: Jul. 14, 2020

(54) SYSTEM AND METHOD FOR EXECUTING A SIMULATION OF A CONSTRAINED MULTI-BODY SYSTEM

(71) Applicant: CMLABS SIMULATIONS INC., Montreal (CA)

(72) Inventors: Sheldon Paul Andrews, Ottawa (CA); Paul Gregory Kry, Montreal (CA); Marek Teichmann, Mont-Royal (CA)

(73) Assignee: CMLABS SIMULATIONS INC., Montreal (CA)

( * ) Notice: Subject to any disclaimer, the term of this patent is extended or adjusted under 35 U.S.C. 154(b) by 3 days.

(21) Appl. No.: 15/959,819

(22) Filed: Apr. 23, 2018

(65) Prior Publication Data

US 2018/0307786 A1    Oct. 25, 2018

Related U.S. Application Data

(60) Provisional application No. 62/488,816, filed on Apr. 23, 2017.

(51) Int. Cl.
*G06F 17/50* (2006.01)
*G06F 17/11* (2006.01)
(Continued)

(52) U.S. Cl.
CPC ............ *G06F 30/20* (2020.01); *B25J 9/1605* (2013.01); *G06F 17/11* (2013.01); *G09B 23/10* (2013.01); *G09B 25/02* (2013.01); *G09B 9/042* (2013.01)

(58) Field of Classification Search
None
See application file for complete search history.

(56) References Cited

U.S. PATENT DOCUMENTS

| 5,625,575 A | 4/1997 | Goyal et al. |
| 5,835,693 A | 11/1998 | Lynch et al. |

(Continued)

FOREIGN PATENT DOCUMENTS

| CN | 102184298 A | 9/2011 |
| CN | 103742587 A | 4/2014 |

(Continued)

OTHER PUBLICATIONS

Seon J. Jang, Yong J. Choi, " Geometrical design method of multi-degree-of-freedom dynamic vibration absorbers", Journal of Sound and Vibration 303 (2007), 2007, pp. 343-356.*

(Continued)

*Primary Examiner* — Tize Ma
(74) *Attorney, Agent, or Firm* — BCF LLP

(57) ABSTRACT

Methods of and systems for executing a simulation of a constrained multi-body system. The method comprises, using a physics engine, simulating the constrained multi-body system, wherein: the constrained multi-body system comprises articulated constraints, the articulated constraints are associated with a geometric stiffness matrix; the geometric stiffness matrix defining a geometric stiffness; a diagonal approximation of the geometric stiffness matrix is generated; and the diagonal approximation is used as part of a stability analysis in which damping is automatically adjusted so that the damping stabilizes the simulation of the constrained multi-body system.

22 Claims, 12 Drawing Sheets

(51) Int. Cl.
*B25J 9/16* (2006.01)
*G06F 30/20* (2020.01)
*G09B 25/02* (2006.01)
*G09B 23/10* (2006.01)
*G09B 9/042* (2006.01)

(56) References Cited

U.S. PATENT DOCUMENTS

| | | |
|---|---|---|
| 7,403,202 B1 | 7/2008 | Nash |
| 7,493,243 B2 | 2/2009 | Choi et al. |
| 7,769,571 B2 | 8/2010 | Bowers |
| 7,904,280 B2 | 3/2011 | Wood |
| 8,005,659 B2 | 8/2011 | Nelson et al. |
| 8,786,613 B2 | 7/2014 | Millman |
| 8,886,501 B2 | 11/2014 | Müller-Fischer et al. |
| 2003/0018455 A1 | 1/2003 | Rosenthal |
| 2004/0248182 A1 | 12/2004 | Rosenthal |
| 2012/0078598 A1 | 3/2012 | McDaniel |
| 2013/0116988 A1 | 5/2013 | Zhang et al. |
| 2015/0109289 A1 | 4/2015 | Mueller-Fischer et al. |
| 2016/0203630 A1* | 7/2016 | Pai .......................... G06T 13/40 345/473 |
| 2016/0292902 A1 | 10/2016 | Milne et al. |

FOREIGN PATENT DOCUMENTS

| | | |
|---|---|---|
| CN | 104019998 A | 9/2014 |
| CN | 104182598 A | 12/2014 |
| CN | 104268326 A | 1/2015 |
| CN | 104358327 A | 2/2015 |
| CN | 106204697 A | 12/2016 |
| EP | 1402503 B1 | 8/2007 |
| JP | 2013158851 A | 8/2013 |
| KR | 20130054602 A | 5/2013 |
| WO | 2017/027957 A1 | 2/2017 |

OTHER PUBLICATIONS

Andrews et al., "Geometric Stiffness for Real-time Constrained Multibody Dynamics", Eurographics, 2017, vol. 36, No. 2, 12 pages.
English Abstract for EP1402503 retrieved on Espacenet on Apr. 18, 2018.
English Abstract for KR20130054602 retrieved on Espacenet on Apr. 18, 2018.
English Abstract for JP2013158851 retrieved on Espacenet on Apr. 18, 2018.
English Abstract for CN106204697 retrieved on Espacenet on Apr. 18, 2018.
English Abstract for CN104268326 retrieved on Espacenet on Apr. 18, 2018.
English Abstract for CN104182598 retrieved on Espacenet on Apr. 18, 2018.
English Abstract for CN104358327 retrieved on Espacenet on Apr. 18, 2018.
English Abstract for CN102184298 retrieved on Espacenet on Apr. 18, 2018.
English Abstract for CN103742587 retrieved on Espacenet on Apr. 18, 2018.
English Abstract for CN104019998 retrieved on Espacenet on Apr. 18, 2018.
Ascher et al., "Computer methods for ordinary differential equations and differential-algebraic equations", 1998, Siam, vol. 61, ISBN-10: 0898714125, ISBN-13: 978-0898714128, 332 pages (Print Screen of Cover Page attached).
Baraff, "Linear-time dynamics using lagrange multipliers", Computer Graphics Proceedings, Annual Conference Series, 1996, SIGGRAPH, USA, pp. 137-146.
Baumgarte, "Stabilization of constraints and integrals of motion in dynamical systems", Computer methods in applied mechanics and engineering, 1972, pp. 1-16.
Barzel et al., "A modeling system based on dynamic constraints", Computer Graphics, 1988, SIGGRAPH, ACM, USA, pp. 179-188.
Baraff et al., "Large steps in cloth simulation", Computer Graphics Proceedings, Annual Conference Series, 1998, ACM, USA, pp. 43-54.
Cline et al., "Post-stabilization for rigid body simulation with contact and constraints", Robotics and Automation, Proceedings, IEEE International Conference, 2003, 8 pages.
Featherstone, "Rigid body dynamics algorithms", 2014, Springer, ISBN 978-0-387-74314-1, ISBN 978-1-4899-7560-7, 276 pages.
Goldenthal et al., "Efficient simulation of inextensible cloth", ACM Transactions on Graphics, 2007, pp. 1-7.
Hahn et al., "Realistic animation of rigid bodies", Computer Graphics, 1988, SIGGRAPH, ACM, USA, vol. 22, pp. 299-308.
Hewlett et al., "Adaptive semi-implicit integrator for articulated mechanical systems", ASME Journal of computational and Nonlinear Dynamics, 2017, vol. 12, 10 pages.
Müller et al., "Meshless deformations based on shape matching", 2005, ACM Trans. Graph., vol. 24, No. 3, 8 pages.
Murray et al., "A mathematical introduction to robotic manipulation", CRC press, 1994, 474 pages.
Nocedal et al., "Numerical optimization", Springer Science & Business Media, ISBN 0-387-98793-2, 651 pages.
Servin et al., "Hybrid, multiresolution wires with massless frictional contacts", IEEE transactions on visualization and computer graphics, 2011, vol. 17, No. 7, 14 pages.
Sherman et al., "Adjustment of an inverse matrix corresponding to a change in one element of a given matrix", The Annals of Mathematical Statistics, 1950, vol. 21, n. 1, pp. 124-127.
Schröder et al., "The virtual erector set: Dynamic simulation with linear recursive constraint propagation", ACM SIGGRAPH Computer Graphics, 1990, vol. 24, pp. 23-31.
Tournier et al., "Stable constrained dynamics", ACM Transactions on Graphics (TOG), 2015, USA, vol. 34, No. 4, 10 pages.
Teran et al., "Robust quasistatic finite elements and flesh simulation", Eurographics/ACM Siggraph Symposium on Computer Animation, 2005, ACM, 11 pages.
Vortex, 2016, http://www.cm-labs.com/, pdf 8 pages.

* cited by examiner

SYSTEM AND METHOD FOR EXECUTING A SIMULATION OF A CONSTRAINED MULTI-BODY SYSTEM

CROSS-REFERENCE TO RELATED APPLICATION

This United States Non-Provisional Application claims priority from U.S. Provisional Application Ser. No. 62/488,816, filed on Apr. 24, 2017, the entire content of which is incorporated herein by reference.

FIELD

The present technology relates to systems and methods of executing a simulation of a constrained multi-body system. In particular, the systems and methods allow introduction of an adaptive damping scheme to stabilize the simulation of the constrained multi-body system.

BACKGROUND

Physics engines, by allowing physics simulation, are at a cornerstone of many applications, including, but not limited to, real-time simulations such as video games, character animation tolls, operator training, robotics control and the like. A common thread in at least some of these applications is the need for realistic simulation maintaining stable behavior while limiting the processing power required. Limiting the processing power required may be an important aspect for real-time applications wherein an acceptable frame rate has to be maintained.

Simulation of constrained multi-body system systems is a challenge in computer animation. Fast and/or approximate methods have been a research topic since the early days of computer graphics. In some instances, it may be desirable to formulate and solve articulated systems in a minimal set of coordinates, such as joint coordinates. While a few physics engines implement joint coordinate solvers, physics engines commonly include constrained multi-body system solvers. As time stepping a constrained full body formulation may result in constraint violations, most solvers include either a Baumgarte feedback term as further detailed in Baumgarte (BAUMGARTE J.: Stabilization of constraints and integrals of motion in dynamical systems. Computer methods in applied mechanics and engineering 1, 1 (1972), 1-16.), a post step as further detailed in Ascher et al. (ASCHER U. M., PETZOLD L. R.: Computer methods for ordinary differential equations and differential-algebraic equations, vol. 61. Siam, 1998.) and/or fast iterative manifold projection as further detailed in Goldenthal et al. (GOLDENTHAL R., HARMON D., FATTAL R., BERCOVIER M., GRINSPUN E.: Efficient simulation of inextensible cloth. ACM Transactions on Graphics (TOG) 26, 3 (2007), 49.). However, when time steps, velocities, constraint forces and/or mass rations are large, simulations may exhibit large constraint errors and may become unstable.

According to known methods, maintaining stable behavior and acceptable real-time frame rate may require tuning physical parameters such as mass, stiffness and damping in order to produce stable behaviour across a broad range of simulation states. Drawbacks of the know methods may be that accuracy may be sacrificed and/or that the tuning of the physical parameters may require a large amount of manual effort from individuals who have good understanding of physics simulation (i.e., typically physics simulation experts). Attempts have been made to improve stability of simulations, in particular simulations relating to dynamic systems with stiff constraints as such simulations may generate transverse vibrations. One such attempt to, at least partially, address the problem of transverse vibrations generated by simulations of dynamic systems with stiff constraints is a constraint stabilization method proposed by Tournier et al. (TOURNIER M., NESME M., GILLES B., FAURE F.: Stable constrained dynamics. ACM Transactions on Graphics (TOG) 34, 4 (2015), 132.). The constraint stabilization method of Tournier et al. allows for time steps and mass ratios that are several orders of magnitude above the range supported by standard single-step methods. However, the constraint stabilization method of Tournier et al. may present some limits as it may, when being applied to rigid body simulation, introduce numerical issues which may affect efficiency of the simulation and may compromise real-time frame rates. In some instances, the intended physical behavior of the simulation may also be affected by dissipative forces.

Improvements are therefore still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) unrealistic physical behavior of a simulation which may occur under certain circumstances, such as, but not limited to, executing a rigid body simulation; (2) manual operations by individuals who have good understanding of physics simulation may be required to tune certain physical parameters; and/or (3) limitations in maintaining an acceptable frame rate for real-time simulations.

In one aspect, various implementations of the present technology provide a method for executing a simulation of a constrained multi-body system. The method comprises:
 using a physics engine, simulating the constrained multi-body system, wherein:
 the constrained multi-body system comprises articulated constraints, the articulated constraints are associated with a geometric stiffness matrix; the geometric stiffness matrix defining a geometric stiffness;
 a diagonal approximation of the geometric stiffness matrix is generated; and
 the diagonal approximation is used as part of a stability analysis in which damping is automatically adjusted so that the damping stabilizes the simulation of the constrained multi-body system.

In another aspect, various implementations of the present technology provide a system for executing a simulation of a constrained multi-body system. The system comprises a processor and a non-transitory computer-readable medium, the non-transitory computer-readable medium comprising control logic which, upon execution by the processor, causes:

operating a physics engine, simulating the constrained multi-body system, wherein:

the constrained multi-body system comprises articulated constraints, the articulated constraints are associated with a geometric stiffness matrix; the geometric stiffness matrix defining a geometric stiffness;

a diagonal approximation of the geometric stiffness matrix is generated; and the diagonal approximation is used as part of a stability analysis in which damping is automatically adjusted so that the damping stabilizes the simulation of the constrained multi-body system.

In other aspects, various implementations of the present technology provide a non-transitory computer-readable medium storing program instructions for executing a simulation of a constrained multi-body system, the program instructions being executable by a processor of a computer-based system to carry out one or more of the above-recited methods.

In other aspects, various implementations of the present technology provide a computer-based system, such as, for example, but without being limitative, an electronic device comprising at least one processor and a memory storing program instructions for executing a simulation of a constrained multi-body system, the program instructions being executable by the at least one processor of the electronic device to carry out one or more of the above-recited methods.

In the context of the present specification, unless expressly provided otherwise, a computer system may refer, but is not limited to, an "electronic device", an "operation system", a "system", a "computer-based system" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
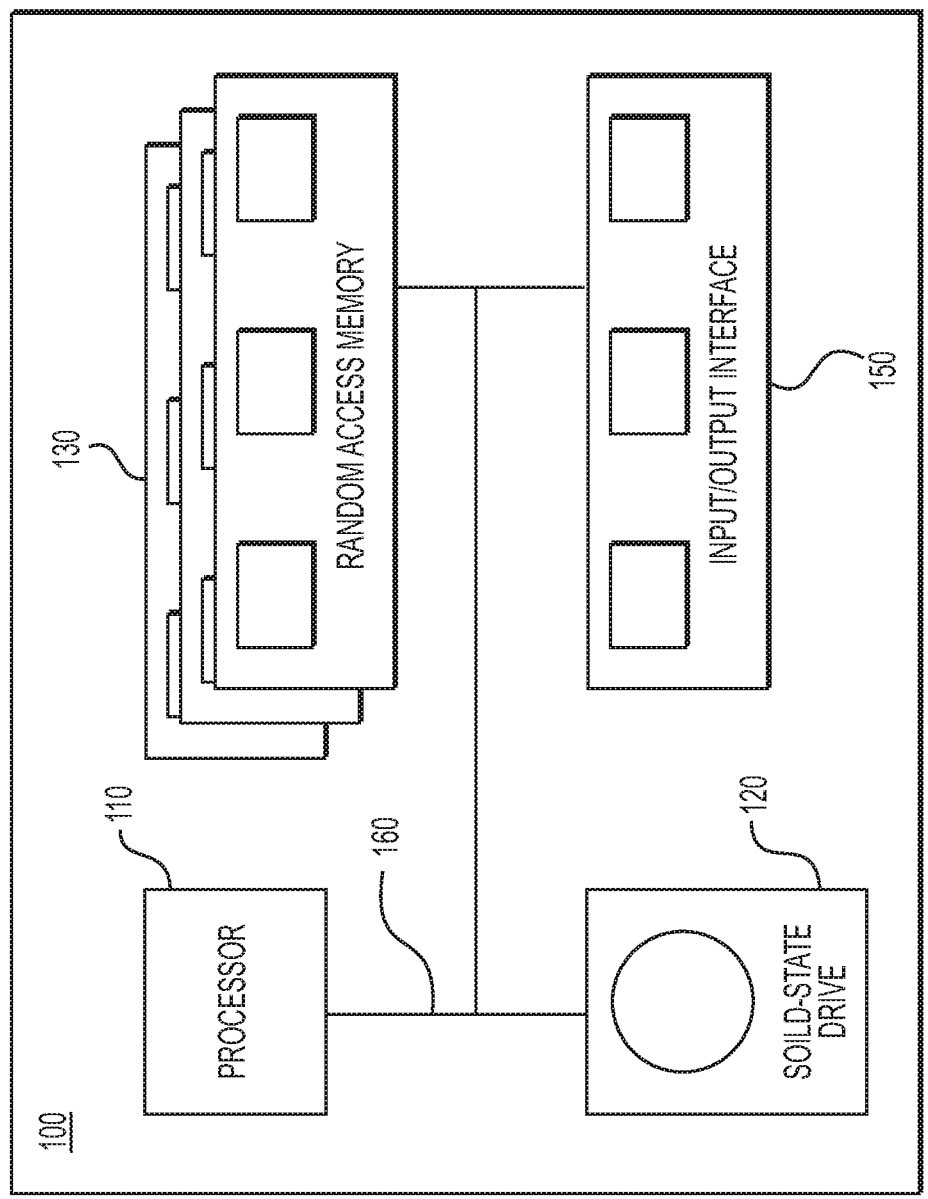
FIG. 1 is a diagram of a computing environment in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general purpose processor, such as a central processing unit (CPU) or a processor dedicated to a specific purpose, such as a digital signal processor (DSP). Moreover, explicit use of the term a "processor", a "simulation application" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

With these fundamentals in place, we will now consider some non-limiting examples to illustrate various implementations of aspects of the present technology.

FIG. 1 illustrates a diagram of a computing environment 100 in accordance with an embodiment of the present technology is shown. In some embodiments, the computing environment 100 may be implemented by any of a conventional personal computer, a computer dedicated to operating simulation and/or an electronic device (such as, but not limited to, a mobile device, a video game system, a tablet device, etc.) and/or any combination thereof appropriate to the relevant task at hand. In some embodiments, the computing environment 100 comprises various hardware components including one or more single or multi-core processors collectively represented by a processor 110 a solid-state drive 120, a random access memory 130 and an input/output interface 150. The computing environment 100 may be a computer specifically designed for operating simulation engines and/or physics engines. In some alternative embodiments, the computing environment 100 may be a generic computer system.

In some embodiments, the computing environment 100 may also be a sub-system of one of the above-listed systems. In some other embodiments, the computing environment 100 may be an "off the shelf" generic computer system. In some embodiments, the computing environment 100 may also be distributed amongst multiple systems. The computing environment 100 may also be specifically dedicated to the implementation of the present technology. As a person in the art of the present technology may appreciate, multiple variations as to how the computing environment 100 is implemented may be envisioned without departing from the scope of the present technology.

Communication between the various components of the computing environment 100 may be enabled by one or more internal and/or external buses 160 (e.g. a PCI bus, universal serial bus, IEEE 1394 "Firewire" bus, SCSI bus, Serial-ATA bus, ARINC bus, etc.), to which the various hardware components are electronically coupled.

The input/output interface 150 may allow enabling networking capabilities such as wire or wireless access. As an example, the input/output interface 150 may comprise a networking interface such as, but not limited to, a network port, a network socket, a network interface controller and the like. Multiple examples of how the networking interface may be implemented will become apparent to the person skilled in the art of the present technology. For example, but without being limitative, the networking interface may implement specific physical layer and data link layer standard such as Ethernet, Fibre Channel, Wi-Fi or Token Ring. The specific physical layer and the data link layer may provide a base for a full network protocol stack, allowing communication among small groups of computers on the same local area network (LAN) and large-scale network communications through routable protocols, such as Internet Protocol (IP).

According to implementations of the present technology, the solid-state drive 120 stores program instructions suitable for being loaded into the random access memory 130 and executed by the processor 110 for executing a simulation of a constrained multi-body system. For example, the program instructions may be part of a library or an application.

Notation

Figure 2:
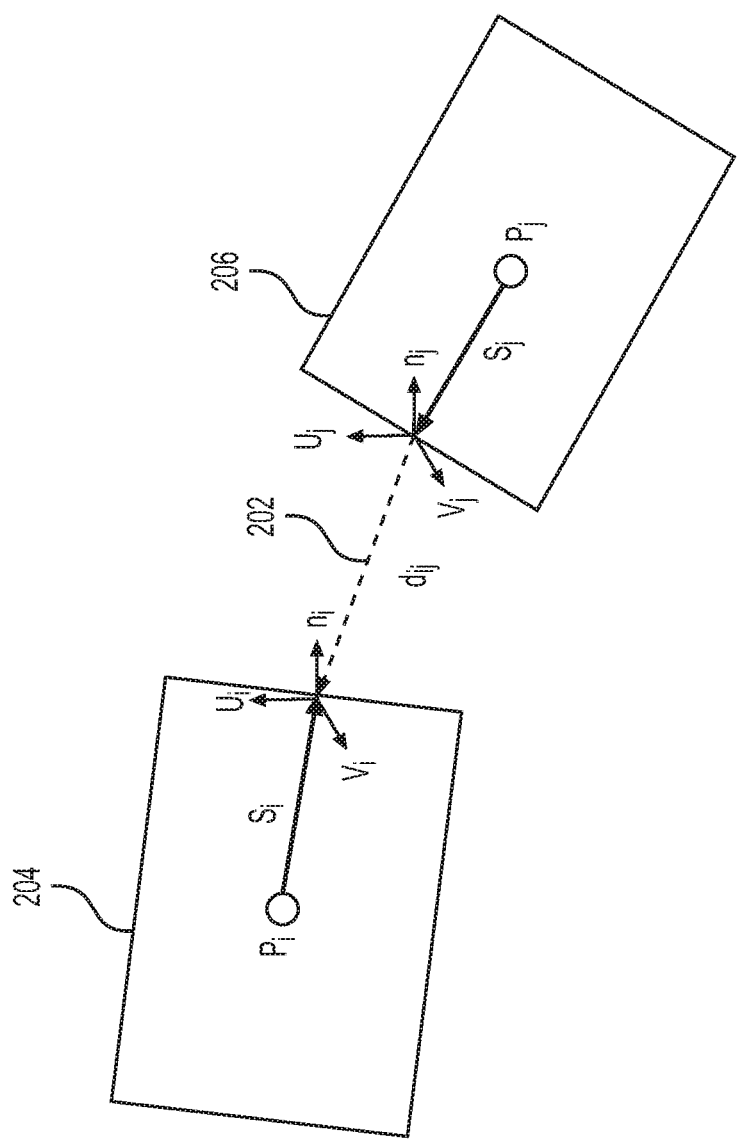
FIG. 2 is a diagram of rigid bodies in accordance with embodiments of the present technology.

In FIG. 2, a diagram 200 illustrates coordinate frames and offsets used to specify configuration of a joint 202. A body 204 (also referred to as the body i) and a body 206 (also referred to as the body j) are coupled by the joint 202 with attachment offsets $s_i$, $s_j$, coordinate frames $\{u_i, v_i, n_i\}$ and $\{u_j, v_j, n_j\}$ and displacement vector $d_{ij}$. The attachment basis and offsets are fixed to the body 204 and the body 206. The offset relative to the center of mass of body i is specified by $s_i$, which is represented in a global coordinate frame but specified by the local vector $s'_i$ such that $s_i = R_i s'_i$. Similarly, orthogonal basis $\{u_i, v_i, n_i\}$ are vectors in the global coordinate frame, but specified by a local basis $\{u'_i, v'_i, n'_i\}$ and transformed by $R_i$. The dependence on a body orientation is relevant for deriving geometric stiffness matrices, such as the geometric stiffness matrices detailed below in connection with the section entitled Constraint library. Unless otherwise stated vector quantities are represented in a global coordinate frame. Table 1 illustrated below provides an overview of variables and notation used throughout the present document.

TABLE 1

Variables and notation used throughout this document.

| | |
|---|---|
| $p_i$ | position of body i |
| $\theta_i$ | orientation of body i |
| $\dot{p}_i$ | linear velocity of body i |
| $\omega_i$ | angular velocity of body i |
| $x_i$ | spatial configuration of body i, such that $x_i = (p_i^T \theta_i^T)^T$ |
| $x$ | configuration of all bodies as $(x_0^T x_1^T \ldots x_n^T)^T$ |
| $v$ | velocity of all bodies as $(\dot{p}_0^T \omega_0^T \ldots \dot{p}_n^T \omega_n^T)^T$ |
| $R_i$ | rotation matrix corresponding to the orientation $\theta_i$ |
| $s'_i$ | joint attachment offset in local frame |
| $s_i$ | joint attachment offset in the global frame, $s_i = R_i s'_i$ |
| $\phi$ | a position level constraint equation |

TABLE 1-continued

Variables and notation used throughout this document.

| | |
|---|---|
| J | a constraint Jacobian matrix, such that $J = \frac{d\phi}{dx}$ |
| J | Jacobian matrix for all constraints |
| $\tilde{K}$ | geometric stiffness matrix |
| • | skew-symmetric cross product matrix of a vector |
| $\square_+$ | an implicit term or quantity |

Geometric Stiffness

In one aspect of the present technology, geometric stiffness may be defined as a tensor encoding variations in constraint force directions. In some embodiments, the tensor may have the following form:

$$\tilde{K} = \frac{\partial J^T}{\partial x} \lambda. \qquad (1)$$

In this equation, J is a matrix of constraint Jacobians, $\lambda$ are constraint forces and x are positions and orientations of bodies in a simulation. Tournier et al. (TOURNIER M., NESME M., GILLES B., FAURE F.: Stable constrained dynamics. ACM Transactions on Graphics (TOG) 34, 4 (2015), 132.), the entirety of which is hereby incorporated by reference in jurisdictions where such incorporation is permissible, introduces the term geometric stiffness as an implicit stiffness in the velocity-level discretization of the constrained dynamical equations:

$$\begin{pmatrix} \tilde{M} & -J^T \\ J & \frac{1}{h^2}C \end{pmatrix} \begin{pmatrix} v_+ \\ h\lambda_+ \end{pmatrix} = \begin{pmatrix} p + hf \\ -\frac{1}{h}\phi \end{pmatrix} \qquad (2)$$

In this equation, $\tilde{M} = M - h^2 \tilde{K}$, $p = Mv$ is a current momentum, f contains external forces, diagonal regularization matrix C makes constraints compliant and h is the time step size. Forming a Schur complement of the upper left block of the equation gives the following reduced system:

$$\left(\frac{1}{h^2}C + J\tilde{M}^{-1}J^T\right)h\lambda += -\frac{1}{h}\phi - J\tilde{M}^{-1}(p + hf) \qquad (3)$$

The reduced system above may be similar to the one used by some open source and/or commercial rigid body physics engines (such as, but not limited to, Bullet, Open Dynamics Engine, Havok, Simmechanics™ from Matlab and Vortex™ from CM Labs). The reduced system above typically requires solving a mixed linear complementarity problem (MLCP) as the system may include both bilateral and unilateral constraints. As it may be appreciated by the person skilled in the art of the present technology, inclusion of geometric stiffness in equations (2) and/or (3) may lead to numerical difficulties upon solving linear systems. In some instances, such difficulties may relate to symmetry, positive definiteness and/or efficiency.

With respect to difficulties relating to symmetry and positive definiteness, in some instances, solving the dense linear system (3) may involve a Cholesky factorization. This may require $\tilde{M}$ to be symmetric and positive definite. This may also be a similar requirement for the system (2). However, inclusion of $\tilde{K}$ may result in a non-symmetric matrix. Tournier el al. suggests that a symmetric approximation of the matrix may be formed with little effect on stabilizing properties. However, the resulting matrix may still fail to meet positive definite requirement of the numerical method. Alternative approaches comprise Teran et al. (TERAN J., SIFAKIS E., IRVING G., FEDKIW R.: Robust quasistatic finite elements and flesh simulation. In Proceedings of the 2005 ACM SIGGRAPH/Eurographics symposium on Computer animation (2005), ACM, pp. 181-190.).), the entirety of which is hereby incorporated by reference in jurisdictions where such incorporation is permissible, which describes a method for enforcing positive definiteness by clamping eigenvalues of a diagonalized elastic deformation gradient to be non-negative. This method may lead to robust simulations but can be costly and therefore may make the method not well suited for real-time and/or performance-focused applications.

With respect to difficulties relating to efficiency, solving the reduced system of equation (3) may require forming an inverse of $\tilde{M}$. For a block diagonal mass matrix, which may be typically the case, this may be done efficiently by inverting linear mass and performing a fast 3×3 inversion of an inertia of each body. However, with inclusion of geometric stiffness, inverting the full mass matrix may no longer be straightforward due to nonzero terms that may appear outside the block diagonal.

To, at least partially, overcome some of the above-discussed difficulties, the present technology provides alternate formulations of geometric stiffness and inclusion of the alternate formulations of the geometric stiffness in multi-body equations. As further discussed in the paragraphs below, the inverse of $\tilde{M}$ may be obtained more efficiently by using low rank updates. In addition, the present technology also provides using diagonalization of the geometrix stiffness matrix as part of a stability analysis. This aspect with also be discussing in the paragraphs below.

Inverse by Low Rank Updates

Some aspects of the present technology relate to a method of constructing an inverse of $\tilde{M}$ using low rank updates. In some circumstances, an unmodified matrix may be relatively efficiently inverted due to a nearly diagonal form of M. However, inverting an augmented mass matrix may require more computational effort (e.g., a lower upper (LU) decomposition) due to off-diagonal elements in a geometrical stiffness matrix.

It should be appreciated that in many instances, geometric stiffness matrix associated with articulated rigid body constraints are sparse and low rank. In some embodiments of the present technology, these properties may be exploited to build an augmented mass matrix more efficiently. In some embodiments, an approach to build the augmented mass matrix may be based on the Sherman-Morrison formula as described in Sherman et al. (SHERMAN J., MORRISON W. J.: Adjustment of an inverse matrix corresponding to a change in one element of a given matrix. The Annals of Mathematical Statistics 21, 1 (1950), 124-127.), the entirety of which is hereby incorporated by reference in jurisdictions where such incorporation is permissible.

Example 1: Decomposition for a Simple Joint

This first example aims at presenting the decomposition associated with a simple articulated joint, in this example, a ball-and-socket. In this example, a geometric stiffness matrix associated with the simple articulated joint is as follows:

$$\tilde{K}_{bs} = \begin{pmatrix} 0 & 0 & 0 & 0 \\ 0 & \hat{\lambda s}_i & 0 & 0 \\ 0 & 0 & 0 & 0 \\ 0 & 0 & 0 & -\hat{\lambda s}_j \end{pmatrix} \in \mathbb{R}^{12 \times 12} \quad (4)$$

In the geometric stiffness matrix (4), $\lambda \in \mathbb{R}^3$ are the Lagrange multipliers enforcing the constraint. As it may be appreciated by the person skilled in the art of the present technology, the geometric stiffness matrix (4) may be qualified as being sparse and associated with a simple structure. In some embodiments of the present technology, a rank decomposition of $\tilde{K}_{bs}$ may be found by examining one of the non-zero blocks of (4) and identifying that s is in a right null space of the matrix $\hat{\lambda s}$.

Starting with a unit vector $$\vec{s} = \frac{s}{\|s\|} \in \mathbb{R}^3,$$

an orthonormal basis may be constructed where:

$$\vec{s} \perp \vec{t}, \vec{r} \perp \vec{t}, \vec{r} \perp \vec{s},$$

$$|\vec{s}| = |\vec{t}| = |\vec{r}| = 1.$$

A column space of $\hat{\lambda s}$ spans a subspace formed by vectors $\vec{r}$ and $\vec{t}$. A vector of Lagrange multipliers may be projected onto this basis, giving the following coefficients:

$$\lambda_r = \lambda^T \vec{r}$$

$$\lambda_s = \lambda^T \vec{s}$$

$$\lambda_t = \lambda^T \vec{t}.$$

As it may be appreciated, $\vec{r}$, $\vec{s}$, and $\vec{t}$ are in a row space of the matrix $\hat{\lambda s}$. Its decomposition is therefore a rank-2 matrix which is as follows:

$$\hat{\lambda s} = \|s\| (\lambda_r \vec{s} \vec{r}^T - \lambda_s \vec{r} \vec{r}^T + \lambda_s \vec{s} \vec{t}^T - \lambda_s \vec{t} \vec{t}^T) \quad (5)$$

This decomposition (5) may be applied to both non-zero 3×3 blocks in the geometric stiffness matrix (4) and used to reconstruct the full matrix $\tilde{K}_{bs}$. Knowing a rank decomposition of the matrix $\tilde{K}_{bs}$ and being able to compute an inverse mass matrix $M^{-1}$, if may become possible to compute an inverse of $\tilde{M}$ by applying the Sherman-Morrison formula.

The Sherman-Morrison Formula

Given a rank-1 matrix $ab^T$ the Sherman-Morrison formula may be used to update the inverse mass matrix $M^{-1}$ by:

$$(M + ab^T)^{-1} = M^{-1} - \frac{M^{-1} ab^T M^{-1}}{1 + b^T M^{-1} a}.$$

An augmented mass matrix $\tilde{M}^{-1}$ may therefore be obtained by sequentially applying rank-1 updates using a geometric stiffness decomposition of all joints in the system.

As an example, we may consider an update to the block of body i using $\lambda_{r_i} \vec{s}_i \vec{r}_i^T$, which is the first term in (5). We may define vectors $\vec{a}, \vec{b} \in \mathbb{R}^{6n}$ with dimensionality matching an n body system. These vectors are zero except entries:

$$\vec{a}_{6i+3} \ldots 6i+5 = \lambda_{r_i} \vec{s}_i$$

$$\vec{b}_{6i+3} \ldots 6i+5 = \vec{r}_i.$$

There vectors are the 3D basis vectors padded with zeros according to block's location in the system matrix. A low rank update of the inverse mass matrix $M \in \mathbb{R}^{6n \times 6n}$ may then be performed by:

$$M^{-1} \leftarrow M^{-1} + h^2 \|s\| \frac{M^{-1} \vec{a} \vec{b}^T M^{-1}}{1 + \vec{b}^T M^{-1} \vec{a}}. \quad (6)$$

The scaling factors $-h^2$ and $\|s\|$ are based on the inclusion of the geometric stiffness in the dynamical equations and length of the attachment offset s. Similar updates may be performed using the rank-1 matrices $\vec{s} \vec{t}^T$, $\vec{r} \vec{r}^T$, and $\vec{t} \vec{t}^T$ and for both bodies. In an embodiment of the present technology, the matrix-vector products of (6) may be computed by exploiting sparsity of the vectors for efficiency purposes. In some embodiments of the present technology, a method to incrementally construct an inverse augmented mass matrix may be similar for other types of joints. Low rank decompositions for joints used in many articulated rigid body simulators may be found in the section "Examples of low rank decompositions for joints used in articulated rigid body simulators" of the present document.

It should be noted that the linear systems of (2) and (3) may not be positive all the time.

Geometric Stiffness Inspired Damping

The present section details a method for diagonalizing $\tilde{K}$ so as to result in a positive definite matrix for the linear system. The diagonalized approximation may then be used as part of a stability analysis where damping may be introduced. In some embodiments, the damping may only be introduced when there is an indication that forces related to the geometric stiffness may cause instability.

In some embodiments of the present technology, $\tilde{K}$ may not represent a material property of the physical system but it may nonetheless be convenient to interpret a geometric stiffness as a physical spring that is able to generate forces in directions transverse to constraints. In some embodiments, the interpretation may facilitate analysis of the geometry stiffness as part of a mass-spring system of undamped harmonic oscillators.

In order to illustrate an embodiment of the present technology, an example of a simple harmonic oscillator system will be detailed. Stability requirements for simulating the simple harmonic oscillator system is considered with a semi-implicit integration scheme which may also be referred to as symplectic Euler. The stability requirements may then be applied to an integrator with less strict stability requirements, such as a single step implicit integrator that is commonly used by interactive computer graphics applications. A stability criterion for stable simulation is derived and is extended to a dynamical system where spring forces are generated by the geometric stiffness, with the $\tilde{K}$ matrix serving as an indicator of when the system may become instable. Thus, damping may be introduced to stabilize the system using an adaptive method (i.e., an adaptive damping scheme) which estimates a damping coefficient that may be large enough to stabilize the system.

Stability Analysis of Harmonic Oscillator

As an example, we consider a behavior of a 1D Hookean mass-spring-damper attached to a particle. Accelerations generated by such a dynamical system may be as follows:

$$\ddot{x} = (-kx - b\dot{x})/m \quad (7)$$

Where x is a displacement from rest length, $\dot{x}$ is a particle velocity, k is a stiffness, b is a damping and m is a mass of the particle. Simulating the dynamical system with a semi-implicit integrator and time step h gives the following velocity and position update:

$$\dot{x} \leftarrow \dot{x} + h\ddot{x},$$

$$x \leftarrow x + h\dot{x}.$$

Substituting (7) and representing updates in matrix form gives the following space equation:

$$\begin{pmatrix} x \\ \dot{x} \end{pmatrix} \leftarrow \underbrace{\begin{pmatrix} 1 - h^2\frac{k}{m} & h - h\frac{b}{m} \\ -h\frac{k}{m} & 1 - h\frac{b}{m} \end{pmatrix}}_{P} \begin{pmatrix} x \\ \dot{x} \end{pmatrix} \quad (8)$$

With the eigenvalues of matrix P given by:

$$-\frac{h^2k + bh - 2m \pm \sqrt{h^4k^2 + 2bh^3k + b^2h^2 - 4h^2km}}{2m}$$

If the magnitude of either eigenvalue is greater than 1, then the simulation may become unstable.

As it may be appreciated from a review of (8), multiple parameters may affect simulation stability. Mass, stiffness and time step may be typically fixed due to application or model requirements. Therefore, in some embodiments of the present technology, only damping may be used to stabilize the dynamical system. In some embodiments of the present technology, non-constitutive damping may be used to stabilize the simulations. In some approaches, non-constitutive damping may be tuned by manually tuning damping coefficients. This may be cumbersome since values must be selected that minimally affect the dynamics, yet leave the simulation stable for a wide range of configurations. To address, at least some of the drawbacks of the manual approach, some embodiments of the present technology rely on an automatic method for computing damping based on a stability region of a semi-implicit integrator.

In some embodiments of the present technology, a single step backward Euler method with a linear approximation of the constraint Jacobian and mass matrix is used. The backward Euler method may bring stability to the simulation with a region of stability which may contain that of the semi-implicit integrator used in the analysis set forth above. Semi-implicit Euler may exhibit absolute stability when the eigenvalues of a phase space linear system lie within a negative real half of a complex plane. This is the region of stability for the integration method whereas backward Euler may have absolute stability for all but a small region in a positive real half of the complex plane. In some embodiments of the present technology, the present technology proposes a stability criterion based on an integrator with a smaller region of stability and then apply it to an implicit integrator. In some embodiments, the stability criterion may come in the form of a threshold based on a behavior of a simple 1D undamped oscillator.

Stability Threshold

In some embodiments, a stability criterion (also referred to as a "stability threshold") may be determined by setting b=0 in eigenvalue equations, giving an undamped oscillator.

This may result in the following stability inequality:

$$\frac{h^2k - \sqrt{h^4k^2 - 4h^2km}}{m} \leq 4, \quad (9)$$

The stability inequality (9) may be true of eigenvalue magnitudes are less than 1.

Alpha Parameter

In some embodiments of the present technology, the stability inequality (9) may be augmented with a parameter $\alpha$ which is a positive scalar value that allows control over how close dynamical system may be to the boundary before damping may be required. This gives the following inequality:

$$\frac{h^2k}{m} \leq 4\alpha. \quad (10)$$

In some embodiments, if the inequality (10) is violated, then the damping required may be found by solving for b at the boundary. This may be computed as:

$$b = \frac{h^2k - 4\alpha m}{2h}. \quad (11)$$

For a spring system with constant mass and stiffness, the value of b may also be constant. However, if the spring parameters are estimated from the geometric stiffness, the damping values may change at each time step. The stability threshold may also vary with the constraint forces. In some embodiments, for the purpose of stabilizing a general class of physics simulation, a stability threshold may be evaluated at each time step and damping values may be computed according to the equation (11) thereby providing an adaptive damping scheme.

In some embodiments, the above analysis may be extended to the $\tilde{K}$ matrix. In some embodiments, the geometric stiffness is associated with the $\tilde{K}$ matrix. Therefore, in some embodiments, a geometric stiffness matrix may be referred to as the $\tilde{K}$ matrix. In some instances, modal analysis may require finding eigenvalues of a matrix $M^{-1}\tilde{K}$ which may be computationally costly. As a result, in some embodiments, the present technology proposes an approximation of the matrix thereby rendering the stability analysis less costly computationally-wise. If the $\tilde{K}$ matrix is diagonal, then the damping scheme for stabilizing a simple harmonic oscillator may be applicable.

Diagonalizing the $\tilde{K}$ Matrix

The present section provides details on how a diagonal approximation simplifying a stability analysis may be computed, in accordance with embodiments of the present technology. One objective of the approach may be to compute a simplified matrix for use as a stability criterion. In some embodiments, the geometric stiffness may be interpreted as a transient spring. In some embodiments, mechanical work done by the $\tilde{K}$ matrix may be considered in building a diagonal approximation $K_d$. An instantaneous transfer of mechanical energy occurring over a single time step, or also referred to as "instantaneous work", done by the geometric stiffness may be $0.5\, v^T \tilde{k}\, v$.

In some embodiments, a diagonal approximation may represent a spring that tends to do at least a same amount of mechanical work, by providing a stiffer system in directions of any typical v. An approximation that tends to upper bound the work may be computed by assigning each diagonal element $K_{di,i}$ norm of a corresponding column vector in $\tilde{K}$, such that:

$$K_{di,i} = |\tilde{K}_i|. \tag{12}$$

Once a diagonal approximation of the geometric stiffness matrix is generated, a stability analysis may be conducted more easily. In some embodiments, in an inertial coordinate frame, it may become a matter of assigning mass and stiffness values and apply equation (11) to compute entry $B_{i,i}$ of the diagonal damping matrix, the mass and stiffness values being as follows:

$$m = M_{i,i}$$

$$k = K_{di,i}$$

In some embodiments, this may be done for all degree-of-freedoms (DOFs), although, in some embodiments, damping coefficients corresponding to translational DOFs may be (but not necessarily) sometimes discarded. An augmented mass matrix may then be rebuilt as the following equation:

$$\tilde{M} = M + hB. \tag{13}$$

Equation (13) may be positive definite since M may be positive definite and B may contain only non-negative values along the diagonal. In this embodiment, B may be seen as replacing the geometric stiffness matrix. As the damping coefficients may augment the mass and inertia of bodies in the system, it may also be referred to the above approach as an "inertial damping" formulation.

Projection to Constraint Space

In some alternative embodiments, damping may be applied to constraint rows of a linear system. Such approach may stabilize in directions that may be aligned with constraint axes. In some cases, simulations may appear more plausible when damping is applied to constraint equations. This may be achieved by mapping the mass and diagonalized geometric stiffness matrix to a constraint space and performing a stability analysis there. The mass M and the diagonal approximation $K_d$ may be mapped onto each constraint row by:

$$m' = (JM^{-1}j^T)^{-1}$$

$$k' = (JK_d^{-1}J^T)^{-1},$$

Where J is the Jacobian for a single constraint equation and m' and k' are effective mass and stiffness, respectively, for the constraint. Coupling of constraints through the mass and stiffness matrix may be ignored. In some embodiments, rather than form an effective mass and stiffness using a full constraint matrix, J may simply be a row vector. This may result in a single scalar value for m' and k'. Stability analysis may be performed using m' and k' by applying the equation (11) to compute a damping coefficient, bfor the constraint. However, a constraint damping term may not be considered by the dynamical equations (2). In such circumstances, the formulation may be modified to support constraint damping.

Constraint Space Damping

In some embodiments, constraint equations may be reorganized as a force equation for a spring-damper system to define the following equation:

$$\lambda_+ = -C^{-1}\phi_+ - B'\dot{\phi}_+ \tag{14}$$

Where B' may be a diagonal matrix of non-negative damping coefficients which may be assembled from the b' computed for each constraint row. Substituting $Jv_+ = \dot{\phi}_+$ and letting $\phi_+ = \phi + h\dot{\phi}_+$, the constraint equations may become:

$$Jv_+ + \Sigma \lambda_+ = -\Gamma \frac{\phi}{h} \tag{15}$$

Where non-zero entries of the diagonal matrices $\Sigma$ and $\Gamma$ may be computed as:

$$\Gamma_{i,i} = \frac{1}{(1 + h^{-1}C_{i,i})B'_{i,i}} \tag{16}$$

$$\Sigma_{i,i} = \frac{h^{-2}C_{i,i}}{(1 + h^{-1}C_{i,i})B'_{i,i}} \tag{17}$$

This may be related to how constrained multibody simulators may allow combination of compliant constraints and Baumgarte stabilization to be interpreted as an implicit stiff spring and damper.

Figure 3:
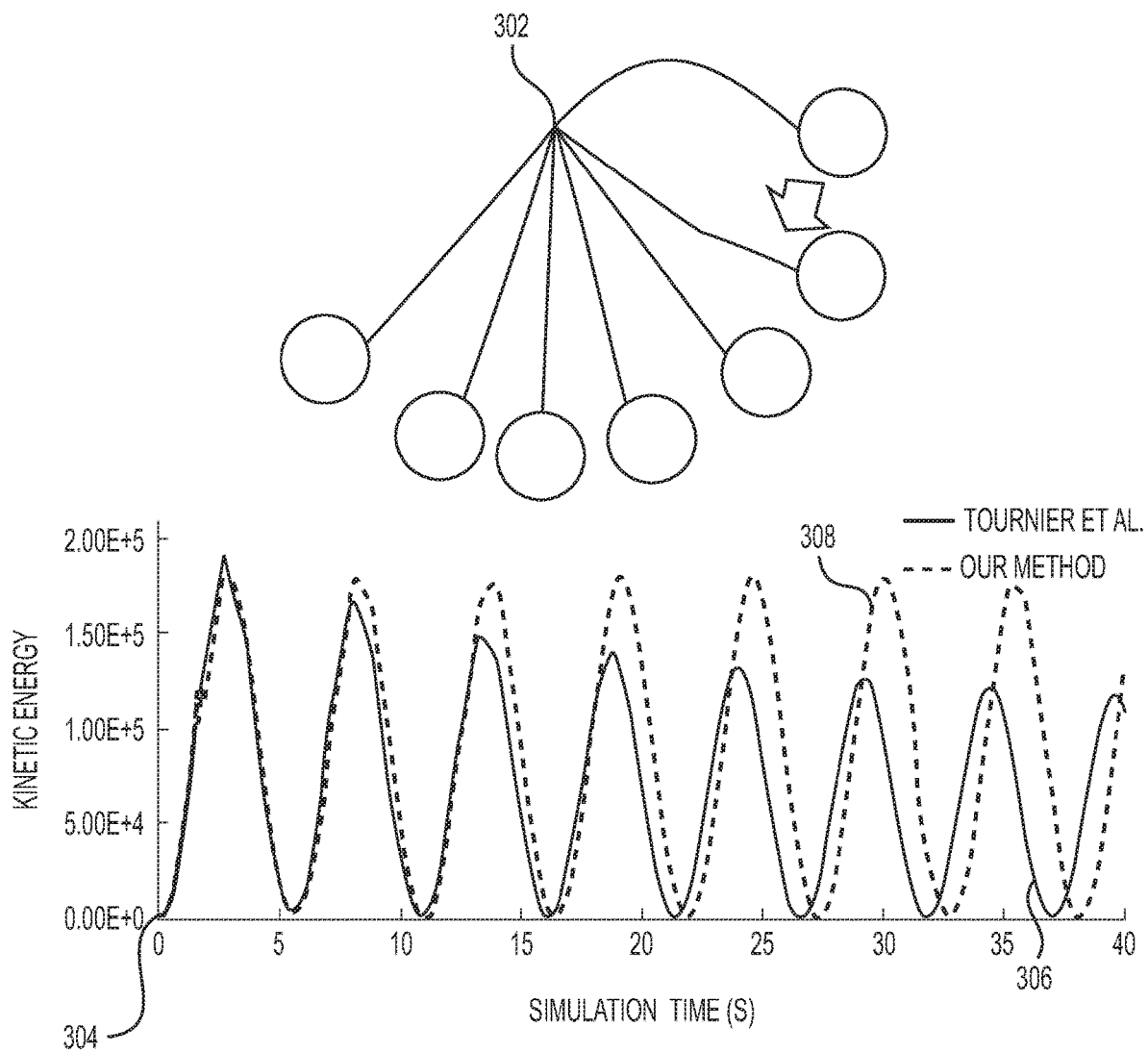
FIG. 3 is a representation of a simulation and a graph in accordance with embodiments of the present technology.

Turning now to FIG. 3, a simulation 302 of a heavy ball (i.e., a 100 Kg load) attached to a flexible cable being dropped and beginning swinging with a pendulum motion is illustrated. A first graph 304 shows kinetic energy when simulated using the method of Tournier et al. according to a first plot 306 and using the method of the present technology according to a second plot 308.

Figure 4:
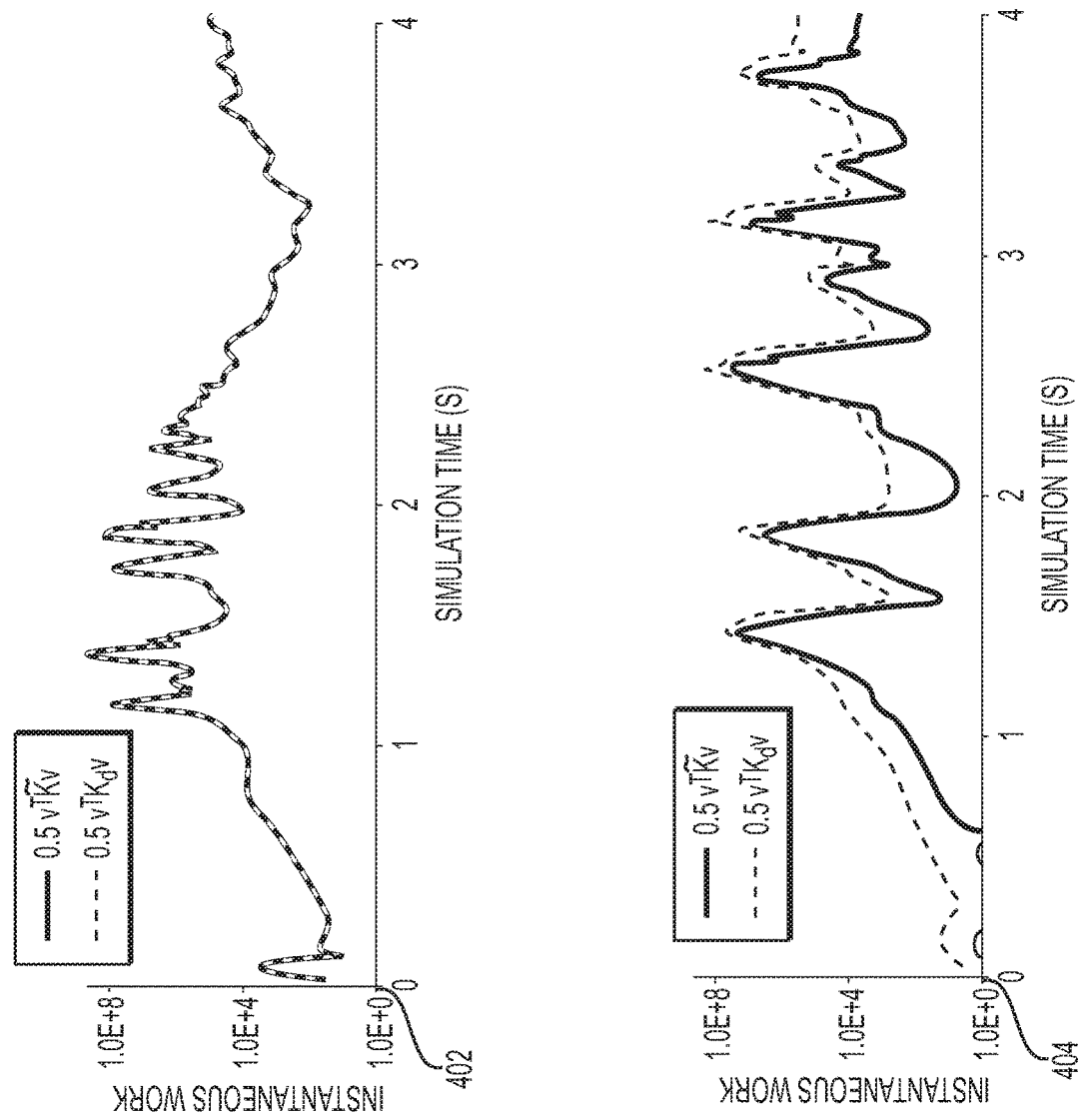
FIG. 4 is a representation of graphs in accordance with embodiments of the present technology.

Turning now to FIG. 4, a second graph 402 and a third graph 404 illustrate instantaneous work at each frame using an original geometric stiffness matrix and a diagonal approximation of the original geometric stiffness matrix to simulate the heavy ball of FIG. 3 using hinge joints (the second graph 402) and a flexible cable joint (the third graph 404). FIG. 4 demonstrates that the approximation set forth above in connection with the equation (12) bounds the instantaneous work. For rotational joints, such as a hinge, the diagonal approximation tends to match the instantaneous work relatively closely, whereas for examples modeled using a flexible cable joint, the instantaneous work may be somehow overestimated but nonetheless achieves the goal of upper bounding the work done by $\tilde{K}$.

Figure 5:
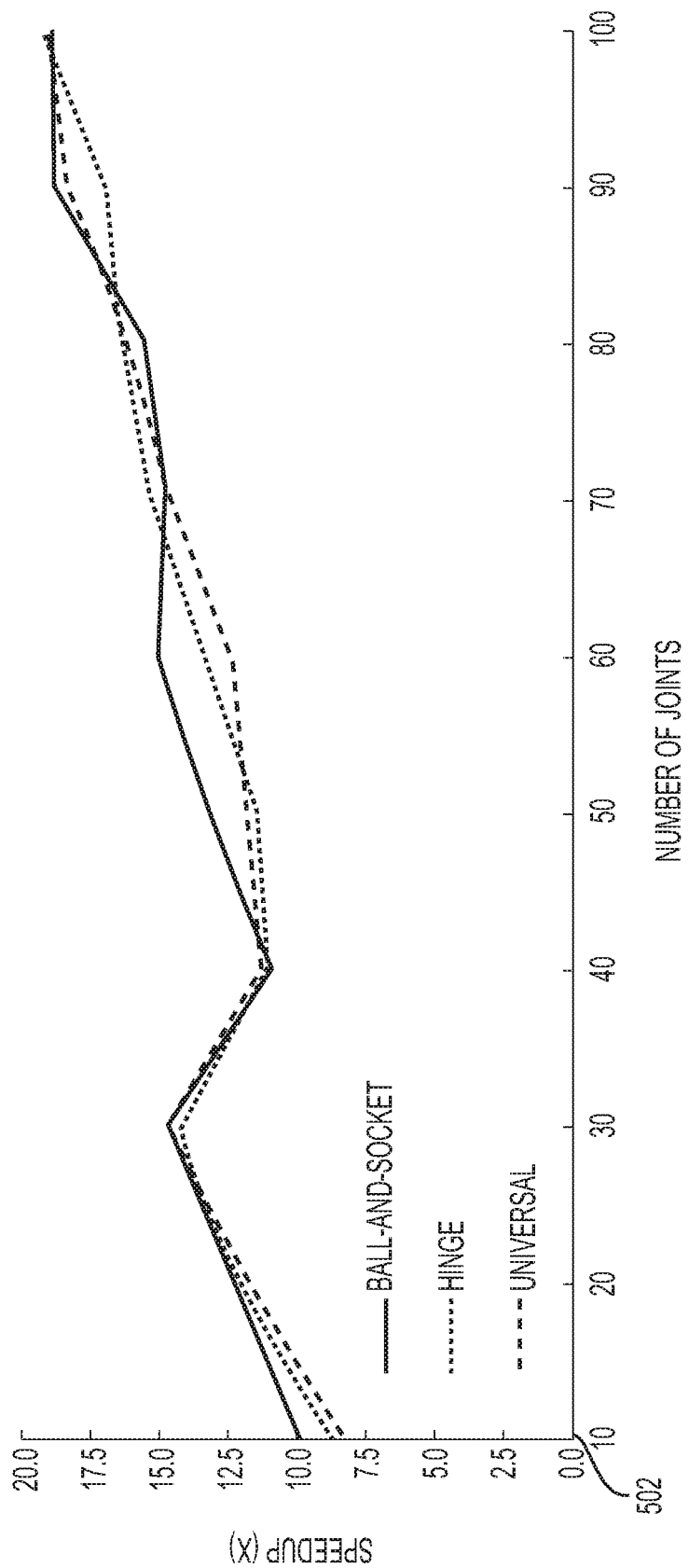
FIG. 5 is a representation of a graph in accordance with embodiments of the present technology.

Turning now to FIG. 5, a fourth graph illustrating performance gains when using low rank updates to compute $\tilde{M}^{-1}$. As it may be appreciated, for angular joints, the gain may appear to scale linearly with the number of joints, in accordance with table 2 below illustrating an average time to compute $\tilde{M}^{-1}$ for a cable using various numbers of ball-and-socket joints.

TABLE 2

| Method | Number of joints | | |
|---|---|---|---|
| | 10 | 50 | 100 |
| Full rank | 0.099 ms | 6.795 ms | 49.668 ms |
| Low rank | 0.010 ms | 0.517 ms | 2.633 ms |
| Gain | 9.81× | 13.13× | 18.87× |

Figure 6:
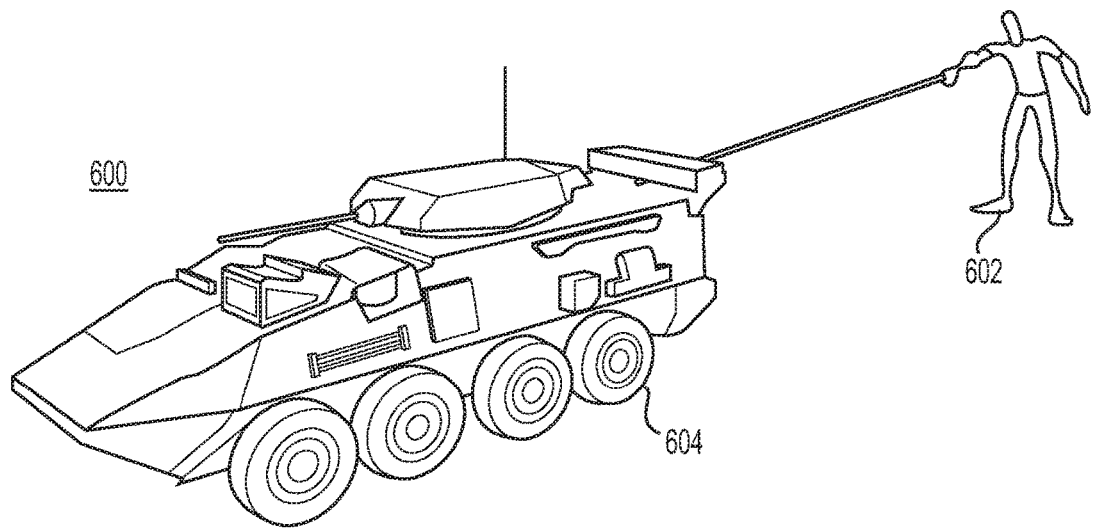
FIG. 6 is a representation of a simulation and a graph in accordance with embodiments of the present technology.
Figure 6:
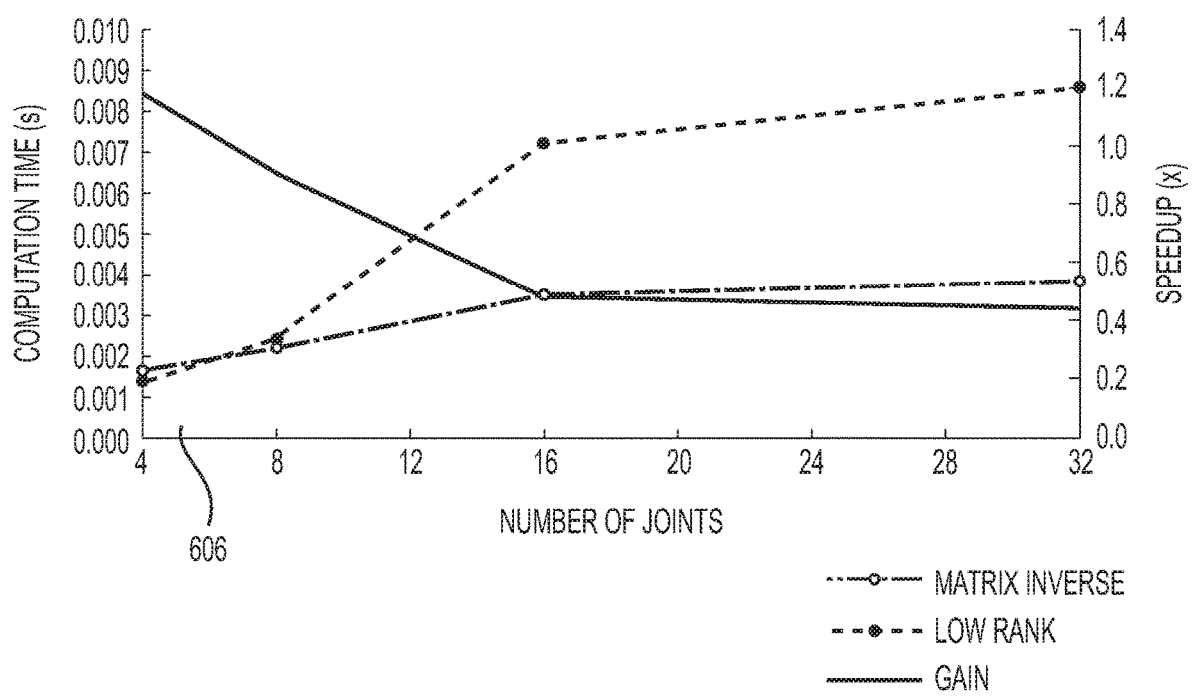

Turning now to FIG. 6, a scene 600 represents a character with super strength 602 preventing a tank 604 from driving away. The scene 600 involves many different joints, including hinges, ball-and-sockets, prismatic and flexible cable joints. FIG. 6 also comprises a fifth graph 606 illustrating performance gains using a low rank inverse for the scene 600. As it may be appreciated, the geometric stiffness matrix for the cable joints is not sparse and, as a result, performance gains may be diminished as a number of joints is increased.

Figure 7:
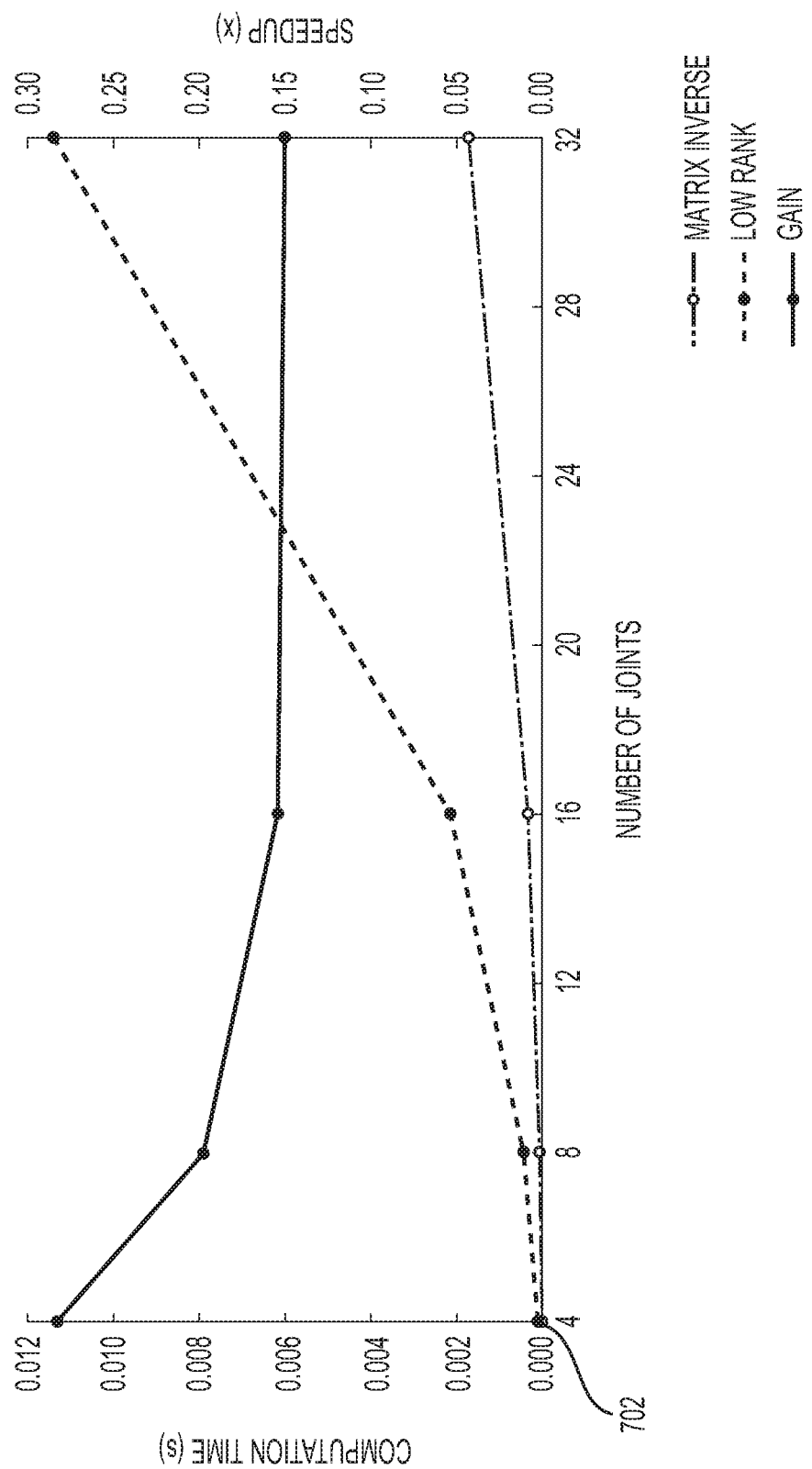
FIG. 7 is a representation of a graph in accordance with embodiments of the present technology.

Turning now to FIG. 7, a sixth graph 702 illustrates performance gain and computation time for cables simulated using various numbers of flexible cable joints. A speedup from low rank updates is mitigated due to a non-sparse structure of the geometric stiffness matrix.

Figure 8:
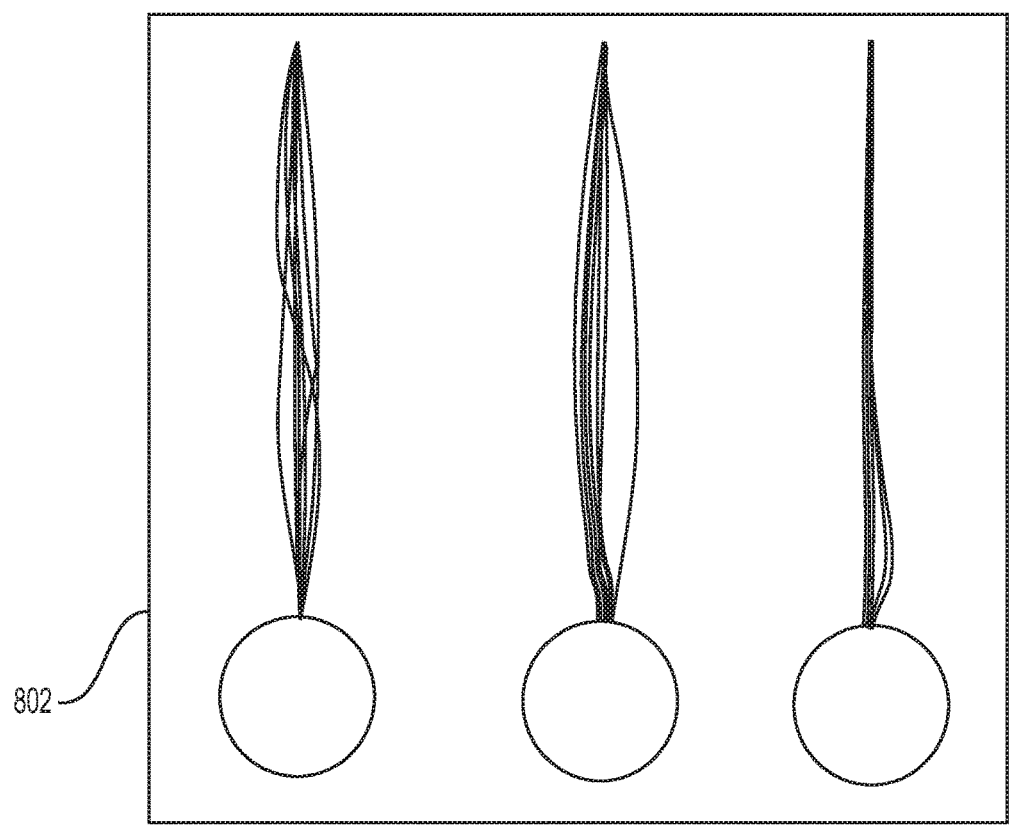
FIG. 8 is a representation of a simulation and a graph in accordance with embodiments of the present technology.
Figure 8:
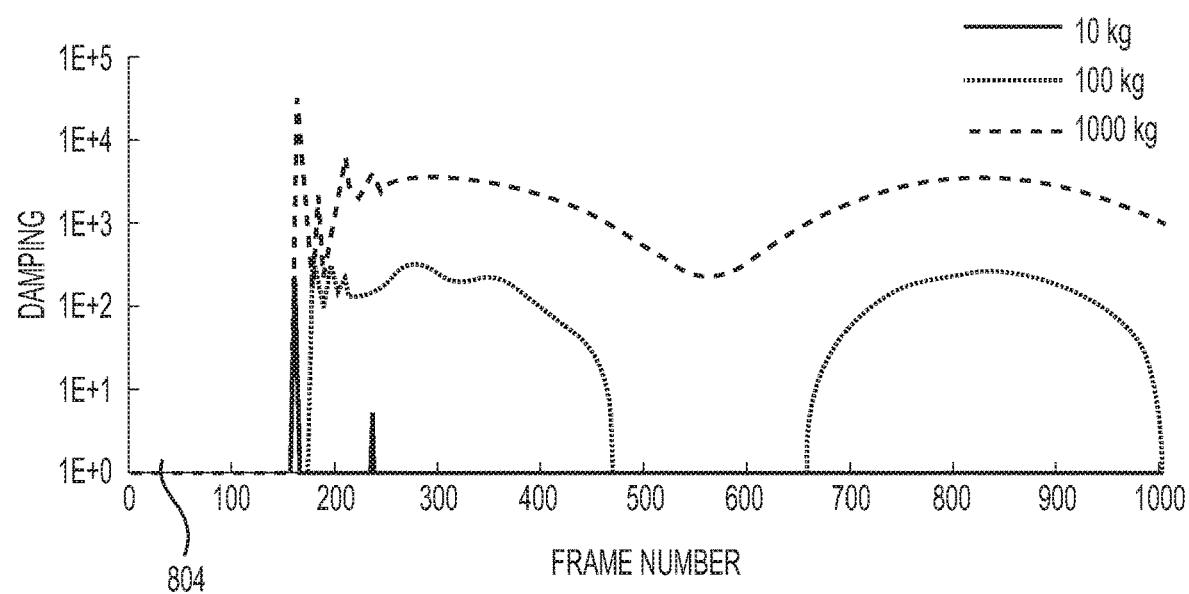

Turning now to FIG. 8, a cable attached to a heavy load is represented in multiple states 802. The states 802 illustrate vibrations in the cable when integrated with a small time step and no damping h=1/100,000 s (left) and large time step h=0.01 s with adaptive damping scheme (middle) and without (right). As may be seen from FIG. 8, dynamical behaviour may be better preserved with the adaptive damping scheme. FIG. 8 also illustrates a seventh graph 804 which illustrates damping coefficients of a selected link for the cable simulation of FIG. 3. For less massive objects (10 Kg) stabilization damping is zero for most of the simulation. As the mass increase, more damping is required as constraint forces increase.

Figure 9:
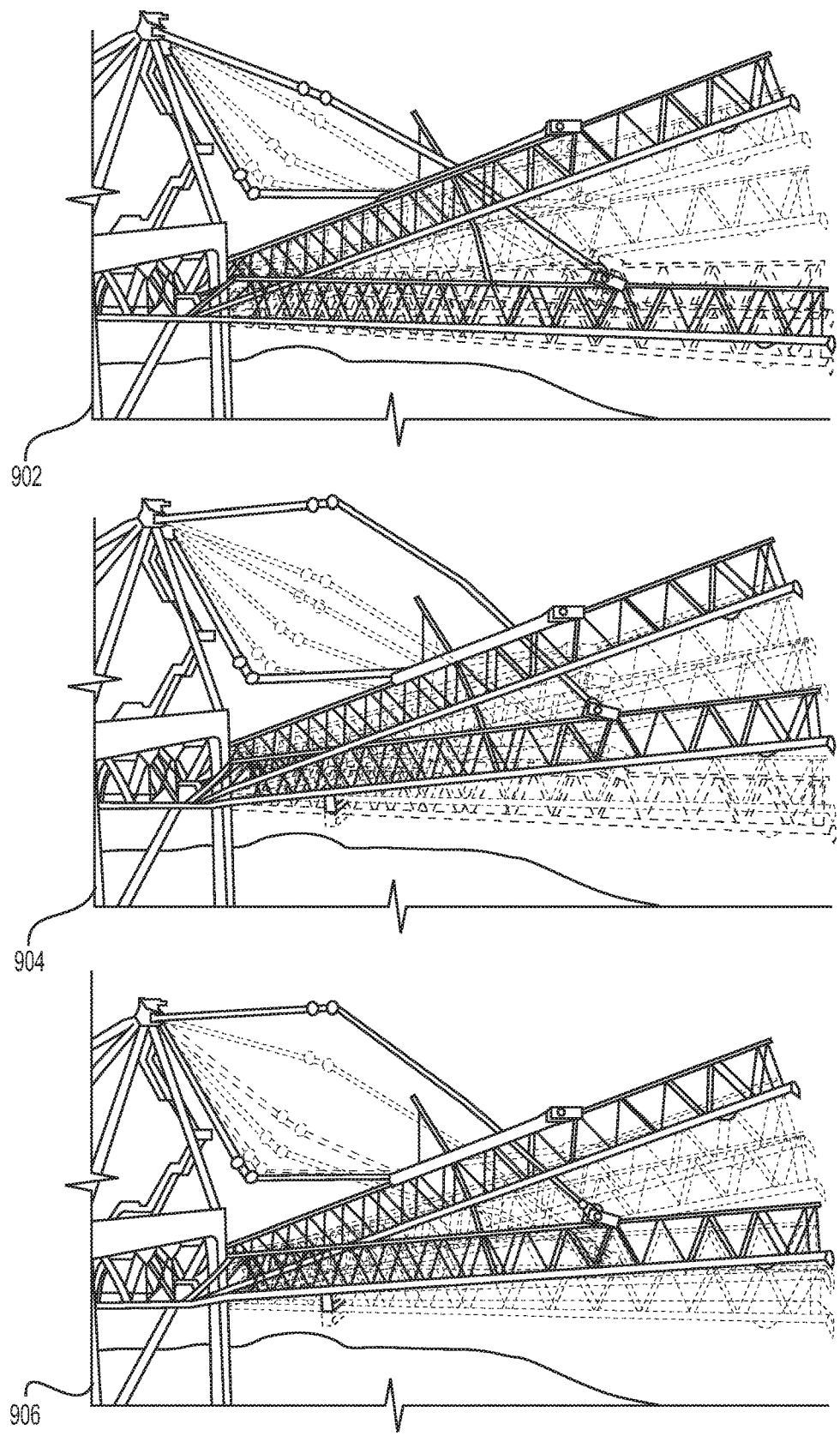
FIG. 9 is a representation of a simulation in accordance with embodiments of the present technology.

Turning now to FIG. 9, scenes 902, 904 and 906 illustrate an overlay of selected frames from a crane simulation in accordance with the present technology. A 100,000 Kg boom is elevated 20 degrees and then dropped. The simulation remains stable for 0.1 s (902), 0.01 s (904) and 0.001 s (906) time steps.

Figure 10:
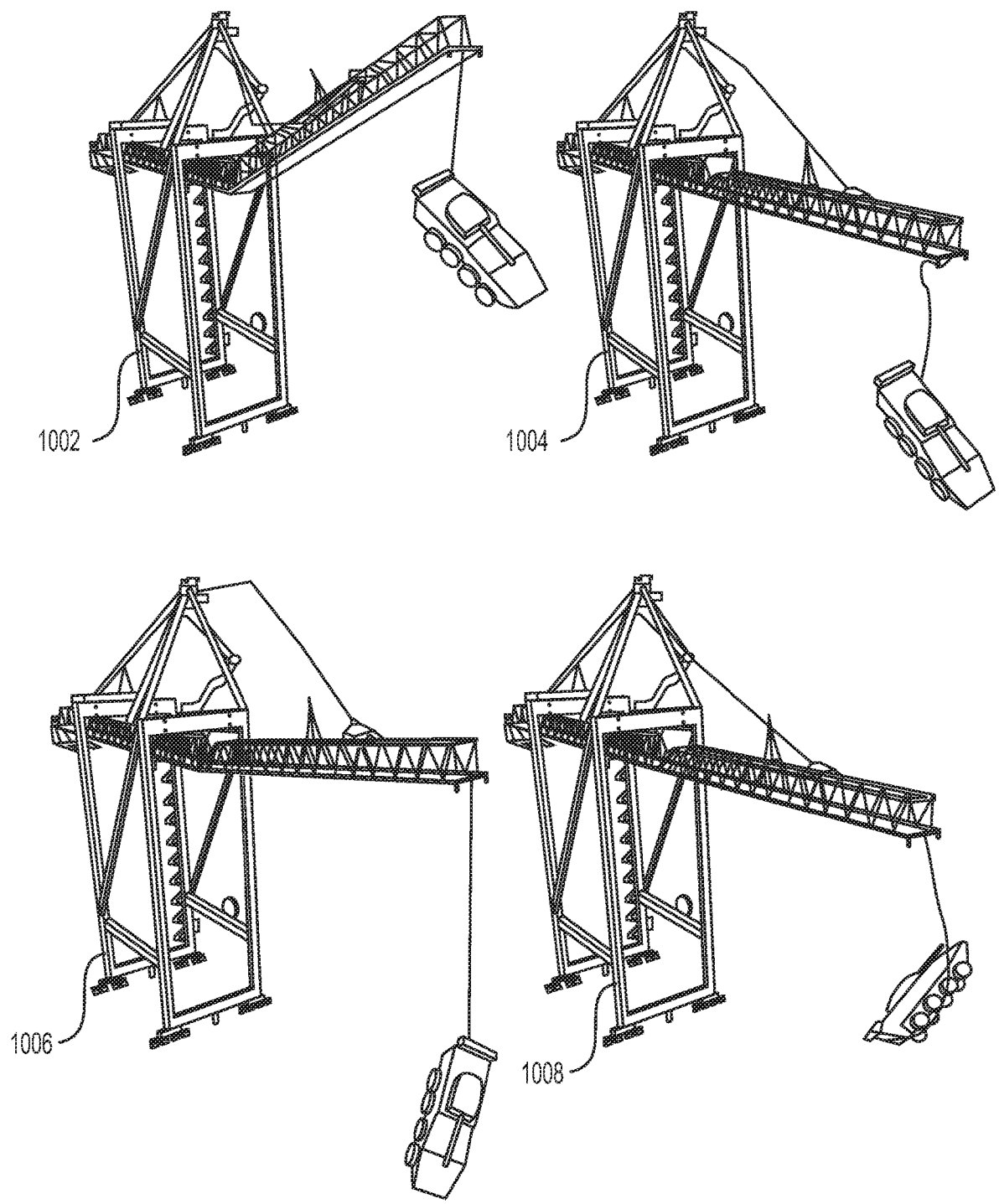
FIGS. 10 and 11 are a representation of a simulation in accordance with embodiments of the present technology.
Figure 11:
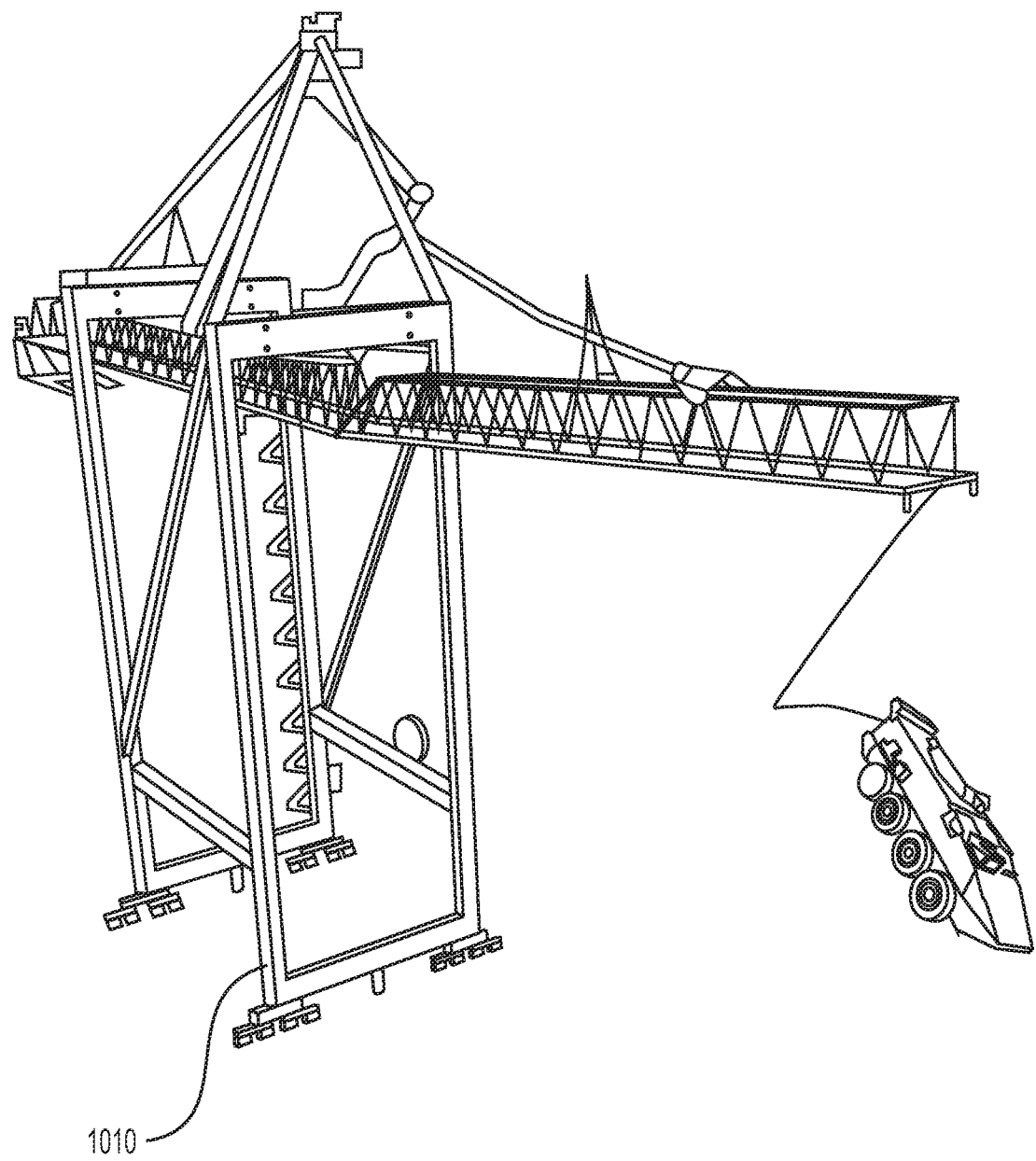

FIGS. 10 and 11 illustrate scenes 1002, 1004, 1006, 1008 and 1010 generated by a simulation in accordance with the present technology. An heavy vehicle attached to a nearly inextensible cable is dropped from an end of a crane. The simulation involves very large mass ratios and heterogeneous collection of joints. The simulation remains stable at a time step of 1/60 s. As it may be appreciated, cable dynamics may be better preserved by the adaptive damping scheme of the present technology.

Results and Discussions

This section provides examples of evaluation of some aspects of the present technology. Some examples aim at examining some of the computational gains from using a method of low rank matrix inversion in accordance with the present technology whereas other examples illustrate potential benefits of some embodiments of the adaptive damping approach of the present technology. Results were obtained using an Intel Core i7™3.3 GHz CPI from Intel and a single thread. Unless otherwise stated, time steps used for experiments is h=0.01 s. The physics engine Vortex™ from CM Labs has been used for the tests. A linear in accordance with the equation (3) is used for all simulations and solved using a standard Cholesky decomposition. The same linear system may also be solved by LU decomposition.

Examples illustrated in FIGS. 3 and 8 use a constraint space damping method whereas as other examples are stabilized by inertial damping.

Performance of Low Rank Updates

Three examples are discussed in the paragraphs below to evaluate computational speedup that may be obtained by using low rank updates in accordance with the present technology.

Articulated Chains

A computational time of low rank updates and full rank matrix inversion is compared in FIG. 5. Articulated chains involving various numbers of joints and joints types are simulated and a computational time required to compute $\tilde{M}^{-1}$ is measured. As indicated by table 2, performance gain grows as a number of joints in the system increases. Likewise, a gain is consistent across hinge, universal and ball-and-socket joints.

Strong Robot

An example involving a heterogeneous collection of joints is shown in FIG. 6. The robot character is modeled using compliant constraints, including 5 ball-and-sockets, 11 universal and 10 hinge joints. Each foot of the robot is anchored to the ground using a hinge joint and each fingertip is attached to an end of the cable using a ball-and-socket joint. Masses range from 0.1 Kg for the finger bodies to 15,000 Kg for the vehicle attached to an opposite end of the cable. The vehicle is driven by a motorized prismatic joint to move it away from the robot. The DOFs in the robot are controlled using implicit PD servos with a set point matching the original pose of the character. This scenario resembles a character animation sequence that might occur in a video game with many different types of joints and large mass ratios. Nevertheless, the simulation remains stable and the motion of the character is smooth.

Flexible Cable Joint

A special joint may be used to model the cable for the scene depicted in FIG. 6. The joint uses several dot-2 constraints, for which the geometric stiffness matrix may be relatively dense. The graph 606 of FIG. 6 shows that performance gains diminish as the number of flexible joints is increased and eventually results in longer computation times. Performance results from these simulations are shown in FIG. 7.

Validation

Evaluation of an adaptive damping method in accordance with the present technology may be conducted by monitoring energy of the system, vibrations in chains and explore the range of damping coefficients for systems with various mass ratios.

Kinetic Energy

Simulation of a pendulum swinging under gravity exchanges potential energy and kinetic energy. If friction and other dissipative elements in the simulation are nominal, the total mechanical energy should be nearly constant. FIG. 3 shows the kinetic energy per time step of a cable with 100 Kg load and pendulum motion. The flexible cable joints have an axial stiffness of $10^{12}$ and bending and torsional stiffness of 10. Using known methods, such as Tournier et al., dissipation caused by geometric stiffness causes a peak kinetic energy to decrease by nearly 40% after 40 seconds of simulation time. When the stability criterion with constraint damping is used, the peak kinetic energy drops by only 2% after the same amount of time, indicating that the mechanical energy in the system is better preserved.

Cable Vibrations

In FIG. 8, vibrations of a cable are visualized when an attached heavy load (in this case 5000 Kg) is dropped straight down and reaches its apex. A simulated behavior with very small time steps and no geometric stiffness or damping is provided for comparison. The vibrations seen when the adaptive damping method in accordance with the present technology is used better represent the observed oscillations in a high fidelity simulation and without the dynamical behavior appears to be over damped.

Damping Coefficients

The graph 804 of FIG. 8 shows the damping coefficients of a selected cable link for the example shown in FIG. 3. The mass is increased from 10 Kg to 100 Kg to 1000 Kg. This may demonstrate that the adaptive damping in accordance with the present technology adapts to constraint forces at a current simulation frame. For smaller masses, damping is only required when load reaches its apex (around frame 160) and constraint forces are largest. As the load increases, damping may be required more often to stabilize the system Other results discussed below demonstrate that the present technology may also be effective by producing stable and interactive simulations with large mass ratios and/or large time steps.

Crane With Heavy Load

FIGS. 10 and 11 shows a 15,000 Kg vehicle attached to a cable being dropped from a crane. The cable is nearly inextensible, with an axial stiffness of $10^{10}$. The mass ratio in the system is similarly large, ranging from 100,000 Kg for the boom to 0.2 Kg for individual cable segments. Despite these challenging parameters, the simulation is stable when integrated using a time step of 1/60 s. The adaptive damping method according to the present technology may help to preserve rich cable dynamics and may be applied to angular velocities of simulation bodies with $\alpha=1.0$. The articulated linkage of the crane is modeled using hinge joints, whereas the cable uses relaxed rigid joints.

Varying Time Steps

A damping coefficient computed in accordance with the present technology may be dependent on the constraint forces and masses of bodies in the simulation. However, the equation (11) may suggest that the damping coefficient may also be dependent on the time step. FIG. 9 illustrates motion of the crane boon when it is dropped from a 20 degrees angle of elevation. Despite large mass ratios and stiff constraints, the simulation remains stable at time steps of 0.1 s, 0.01 s and 0.001 s. Also, the dynamical behavior in each case may be similar, although for the largest time step value the simulation may not appear to be more damped and may exhibit less high frequency dynamics.

Constraint Space Vs Inertial Damping

For cable simulations, artifacts may be observed when using inertial damping formulation. Specifically, there may be dissipation about the torsional axis.

The constraint space damping method in accordance with the present technology may be well suited for 6D rigid and flexible cable joints. In some embodiments, constraint space may be augmented by additional constraint rows with negligible compliance values. This may be done automatically at each time step or manually when the simulation model is being designed.

In some embodiments, articulated simulations may be stabilized by only damping rotational DOFs. For many applications, such as physics-based character animation only hinges, universal and/or ball-and-socket joints may be used to model characters. We may however observe that for mechanisms using the dot-2 constraint, such as the prismatic and the flexible cable joint, applying damping to the translational degrees of freedom may result in a behavior where bodies appear to move through a viscous fluid. For such cases, we may simply discard the translational damping coefficient and we may set $B_{i,i}=0$ for these DOFs. This may help to prevent viscosity artifacts, especially for cable simulation, but may have similar stabilizing properties.

As it may be appreciated, some aspects of the present technology may provide at least some benefits. Using the geometric stiffness in its diagonal form, a stability criterion may be used to adaptively introduce a minimal amount of damping a three fold may benefit: (i) the system matrix may remain positive definite, permitting more efficient numerical solvers; (ii) the effort of manually tuning artificial damping coefficients may be reduced and (iii) stable simulation systems with unprecedented stiffness and/or mass rations may be possible at real-time frame rates.

Constraint Library

This section contains derivations of the geometric stiffness for a basic set of constraints that may be commonly used in articulated rigid body simulation. Each derivation considers the case of a two body system where the geometric stiffness may be represented by a 12×12 matrix. For succinctness, the 3×3 block structure of theses matrices is exploited.

Basic Partial Derivatives

The instantaneous angular velocity $\omega$ of a body and the time derivative of its rotation matrix $\dot{R}$ are related by $$\hat{\omega} = \dot{R}R^{-1}. \tag{18}$$

We can reinterpret this lemma for small angular displacements $\partial\theta$ such that $$\partial\hat{\theta} = dRR^{-1},$$

and post-multiplying by R gives $$\partial\hat{\theta}R = dR. \tag{19}$$

Furthermore, for a vector $n \in \mathbb{R}^3$ attached to a rotating body such that $n = Rn^1$, the spatial derivative of the vector is given by $$\frac{\partial n}{\partial \theta} = \hat{n}. \tag{20}$$

Equations (19) and (20) may be the building blocks used to derive the geometric stiffness equations for a basic constraint library. Additional mathematical details of rigid body kinematics may be found in Murray et al. (MURRAY R. M., LI Z., SASTRY S. S., SASTRY S. S.: A mathematical introduction to robotic manipulation. CRC press, 1994.), the entirety of which is hereby incorporated by reference in jurisdictions allowing such incorporation.

Ball- and Socket Joint

A ball-and-socket, or spherical, joint connecting bodies i and j constrains two points on the bodies to have the same position while allowing relative angular motion. The constraint equation can be written as $$\phi_{bs} = p_i + s_i - p_j - s_j = 0.$$

Rearranging Eq. 18 gives $\dot{R} = \hat{\omega}R$, and so She time derivative of the constraint equation can be written as $$\dot{\phi}_{bs} = \dot{p}_i - \hat{s}_i\omega_i - \dot{p}_j + \hat{s}_j\omega_j,$$

giving the constraint Jacobian matrix $$J_{bs} = (I \ -\hat{s}_i \ -I \ \hat{s}_j).$$

Its other words, $$\dot{\phi}_{bs} = J_{bs}\begin{pmatrix} \dot{p}_i \\ \omega_i \\ \dot{p}_j \\ \omega_j \end{pmatrix}.$$

The constraint forces acting on fee two bodies are $$J_{bs}^T \lambda_{bs} = \begin{pmatrix} \lambda_{bs} \\ \hat{s}_i \lambda_{bs} \\ -\lambda_{bs} \\ -\hat{s}_j \lambda_{bs} \end{pmatrix}, \tag{21}$$

where $\lambda_{bs} \in \mathbb{R}^3$ are the Lagrange multipliers for the ball-and-socket constraint. Differentiating Eq. 21 with respect to the spatial configuration of the bodies and applying the chain rule gives $$\frac{\partial J_{bs}^T \lambda_{bs}}{\partial x} = J_{bs}^T \frac{\partial \lambda_{bs}}{\partial x} + \frac{\partial J_{bs}^T}{\partial x} \lambda_{bs},$$

where the first term is zero and the second term is the geometric stiffness matrix of the joint, or $$\tilde{K}_{bs} = \frac{\partial J_{bs}^T}{\partial x} \lambda_{bs}.$$

Expanding this into 3×3 blocks gives $$\tilde{K}_{bs} = \begin{pmatrix} 0 & 0 & 0 & 0 \\ 0 & \hat{\lambda}_{bs}\hat{s}_i & 0 & 0 \\ 0 & 0 & 0 & 0 \\ 0 & 0 & 0 & -\hat{\lambda}_{bs}\hat{s}_j \end{pmatrix}. \quad (22)$$

Noting that $s_i = R_i s'_i$ and $s_j = R_j s'_j$, equation (22) matches the matrix provided in Tournier et al.

Axial Lock

An axial lock constrains the angular motion about a single axis. The constraint Jacobian matrix is the 12 component row vector $$J_n(0 n_i^T 0 -n_i^T)$$

where the locked axis of rotation $n_i$ is fixed to body i. The geometric stiffness for this constraint is $$\tilde{K}_{ax,n} = \begin{pmatrix} 0 & 0 & 0 & 0 \\ 0 & -\lambda_{ax}\hat{n}_i & 0 & 0 \\ 0 & 0 & 0 & 0 \\ 0 & \lambda_{ax}\hat{n}_i & 0 & 0 \end{pmatrix}. \quad (23)$$

Universal Joint

The universal, or Hooke, joint has similar behavior to the spherical joint, but removes a rotational degree of freedom by keeping an axis fixed to body i perpendicular fixed to body j. The constraint equations for this joint can be written as $$\phi_{bs} = p_i s_i - p_j - s_j = 0$$

$$\phi_{d1,u} = n_i^T u_j = 0$$

where $n_i$ is a unit vector in coordinate frame of body i which should remain orthogonal to unit vector $u_j$ in coordinate frame of body j. Since the derivation of $\phi_{bs}$ is the same as previously discussed, we instead focus on the dot-1 constraint $\phi_{d1}$. The Jacobian matrix of the dot-1 constraint is $$J_{d1,u} = (0 (\hat{n}_i u_j)^T 0 - (\hat{n}_i u_j)^T).$$

Note that for vectors a, b $\in \mathbb{R}^3$ that $\hat{a}b = -\hat{b}a$ and $(\hat{a}b)^T = -b^T \hat{a}$. The geometric stiffness for the dot-1 constraint is $$\tilde{K}_{d1,u} = \begin{pmatrix} 0 & 0 & 0 & 0 \\ 0 & \eta & 0 & -\eta^T \\ 0 & 0 & 0 & 0 \\ 0 & -\eta & 0 & \eta^T \end{pmatrix} \quad (25)$$

where $\eta = \lambda_{d1} \tilde{u}_j \hat{n}_i$ and the scalar value $\lambda_{d1} \in \mathbb{R}$ is the Lagrange multiplier of the dot-1 constraint at Else previous time step. The geometric stiffness for the universal joint may be assembled as $$K_{un} = K_{bs} + K_{d1,u}.$$

Hinge Joint

The hinge, or revolute, joint allows a relative rotation of two bodies about a single axis. The joint behaves much like a universal, but with an additional dot-1 constraint equation $$\phi_{bs} = p_i + s_i - p_j - s_j = 0$$

$$\phi_{d1,u} = n_i^T u_j = 0$$

$$\phi_{d1,v} = n_i^T v_j = 0$$

where $v_j$ is a unit vector in coordinate frame of body j which is orthogonal to $u_j$ and is constrained to be perpendicular to $n_i$. The geometric stiffness $\tilde{K}_{d1,v}$ for the dot-1 constraint between vector $v_j$ and $n_i$ is found by applying Eq. 25 and substituting $v_j$ or $u_j$. The hinge geometric stiffness is then assembled as $$\tilde{K}_{ni} = \tilde{K}_{bs} + \tilde{K}_{d1,u} + \tilde{K}_{d1,v}.$$

Prismatic Joint

A prismatic joint allows a relative translation between two bodies along a single axis. The constraint equations for this joint can be written as $$\phi_{d1,u} = n_i^T u_j = 0$$

$$\phi_{d1,v} = n_i^T v_j = 0$$

$$\phi_{d1,n} = u_i^T n_j = 0$$

$$\phi_{d2,u} = d_{ij}^T u_i = 0$$

$$\phi_{d2,v} = d_{ij}^T v_i = 0$$

where $d_{ij} = p_i + s_i - p_j - s_j$. This joint consists of three dot-1 constraints (top rows), plus equations $\phi_{d2,u}$ and $\phi_{d2,v}$, which are dot-2 constraints, A single Lagrange multiplier is used for each dot-2 constraint, which together eliminate relative translation of the bodies along any axes perpendicular to $n_i$.

Using $\phi_{d2,u}$ as an example, which constrains relative motion in the direction $u_i$, the Jacobian matrix is $$J_{d2,u} = (u_i^T u_i^T (\hat{d}_{ij} - \hat{s}_i) - u_i^T u_i^T \hat{s}_j) \quad (26)$$

with the constraint Jacobian for $\phi_{d2,v}$ having a similar form. The geometric stiffness matrix fat $J_{d2,u}$ is $$\tilde{K}_{d2,u} = \lambda_{d2,u} \begin{pmatrix} 0 & \hat{u}_i^T & 0 & 0 \\ \hat{u}_i & (\hat{d}_{i,j} - \hat{s}_i)\hat{u}_i & \hat{u}_i^T & (\hat{s}_j \hat{u}_i)^T \\ 0 & \hat{u}_i & 0 & 0 \\ 0 & \hat{s}_j \hat{u}_i & 0 & -(\hat{s}_j \hat{u}_i)^T \end{pmatrix}. \quad (27)$$

The matrix $\tilde{K}_{d2,v}$ may be found by applying Eq. 27 and substituting $v_i$ for $u_i$. The geometric matrix for the prismatic joint is competed as $$\tilde{K}_{pr} = \tilde{K}_{d1,u} + \tilde{K}_{d1,v} + \tilde{K}_{d1,n} + \tilde{K}_{d2,u} + \tilde{K}_{d2,v}.$$

Rigid Joint

The prismatic joint is augmented with a sixth constrains equation that restricts the translational motion of the bodies, effectively constraining the rotational and translational motion of the two bodies to be file same. This is done using an additional dot-2 constraint.

$$\phi_{d2,n} = d_{ij}^T n_i = 0.$$

The geometric stiffness matrix of the rigid joint is then computed as $$\tilde{K}_{6D} = \tilde{K}_{pr} + \tilde{K}_{d2,u}.$$

Flexible Cable Joint

By choosing small or moderate compliances for the rigid joint, the constraint rows are relaxed and the joint becomes flexible. Compliance and damping values are then selected for each of the three rotational and three translational constrained degrees of freedom to match the behavior of an extensible cable. For example, Eq. 16 and Eq. 17 are tuned in this way for the cable results shown in Section 5.

Low Rank Decompositions

This section provides low rank decompositions of basic constraint library set forth above. All factorizations consider the case of a two body system with 12×12 geometric stiffness matrix, although decompositions for larger systems may be possible.

Ball- and Socket

The low rank factorization of $\tilde{K}_{bs}$ follows from the analysis in Section 3.1. The vectors $\vec{r}$, $\vec{s}$, $\vec{t}$ and the Lagrange multipliers $\lambda_r$, $\lambda_s$, $\lambda_t$ are used with subscripts to indicate the body index. Using this notation, the decomposition is as follows:

$$\bar{s}_i = (0 \ \vec{s}_i^T \ 0 \ 0)^T$$

$$\bar{r}_i = (0 \ \vec{r}_i^T \ 0 \ 0)^T$$

$$\bar{t}_i = (0 \ \vec{t}_i^T \ 0 \ 0)^T$$

$$\bar{s}_j = (0 \ 0 \ 0 \ \vec{s}_j^T)^T$$

$$\bar{r}_j = (0 \ 0 \ 0 \ \vec{r}_j^T)^T$$

$$\bar{t}_j = (0 \ 0 \ 0 \ \vec{t}_j^T)^T$$

$$\tilde{K}_{bs} = \|s_i\|(\lambda_{r_i}\bar{s}_i\vec{r}_i^T - \lambda_{s_i}\vec{r}_i\vec{r}_i^T + \lambda_{r_i}\bar{s}_i\vec{t}_i^T - \lambda_{s_i}\bar{t}_i\vec{t}_i^T) - \|s_j\|$$
$$(\lambda_{r_j}\bar{s}_j\vec{r}_j^T - \lambda_{s_j}\vec{r}_j\vec{r}_j^T + \lambda_{r_j}\bar{s}_j\vec{t}_j^T - \lambda_{s_j}\bar{t}_j\vec{t}_j^T).$$

Axial Constraint

The axial constraint decomposition has the following form:

$$\bar{u}_i = (0 \ u_i^T \ 0 \ 0)^T$$

$$\bar{v}_i = (0 \ v_i^T \ 0 \ 0)^T$$

$$\bar{u}'_i = (0 \ 0 \ 0 \ u_i^T)^T$$

$$\bar{v}'_i = (0 \ 0 \ 0 \ v_i^T)^T$$

$$\tilde{K}_{ax} = \lambda(-\bar{u}_i\bar{v}_i^T + \bar{v}_i\bar{u}_i^T + \bar{u}'_i\bar{v}_i^T - \bar{v}'_i\bar{u}_i^T).$$

Dot-1 Constraint

The decomposition for the dot-1 constraint follows the Jacobian definition from Eq. 24, using vectors $n_i$ and $u_j$, but the decomposition is valid for other vector pairings. The low rank decomposition of the dot-1 geometric stiffness matrix is:

$$\bar{n} = (0 \ 0 \ 0 n_i^T)^T$$

$$\bar{u} = (0 \ -u_j^T \ 0 \ 0)^T$$

$$\bar{n}' = (0 \ -n_i^T \ 0 \ n_i^T)^T$$

$$\bar{u}' = (0 \ -u_j^T \ 0 \ u_j^T)^T$$

$$\tilde{K}_{d1,u} = \lambda(\bar{u}\bar{n}^T + \bar{n}'\bar{u}^T).$$

Dot-2 Constraint

Finally, for the dot-2 constraint we begin by forming an orthonormal basis using the vector $$\vec{d}_{ij} = \frac{d_{ij}}{\|d_{ij}\|},$$

such that $$\vec{d}_{ij} \perp \vec{e}_{ij}, \ \vec{e}_{ij} \perp \vec{f}_{ij}, \ \vec{d}_{ij} \perp \vec{f}_{ij}, \ \|\vec{d}_{ij}\| = \|\vec{e}_{ij}\| = \|\vec{f}_{ij}\| = 1.$$

This basis, along with the orthonormal bases $\vec{r}_i$, $\vec{s}_i$, $\vec{t}_i$ and $\vec{r}_j$, $\vec{s}_j$, $\vec{t}_j$, is projected onto the constraint coordinate vectors $v_i$, and $n_i$ giving the coefficients

| | | | |
|---|---|---|---|
| $\rho_{i,n} = \vec{r}_i^T n_i$ | $\rho_{i,v} = \vec{r}_i^T v_i$ | $\tau_{i,n} = \vec{t}_i^T n_i$ | $\tau_{i,v} = \vec{t}_i^T v_i$ |
| $\rho_{j,n} = \vec{r}_j^T n_i$ | $\rho_{j,v} = \vec{r}_j^T v_i$ | $\tau_{j,n} = \vec{t}_j^T n_i$ | $\tau_{j,v} = \vec{t}_j^T v_i$ |
| $\upsilon_n = \vec{f}_{ij}^T n_i$ | $\upsilon_v = \vec{f}_{ij}^T v_i$ | $\kappa_n = \vec{e}_{ij}^T n_i$ | $\kappa_v = \vec{e}_{ij}^T v_i.$ |

We also define the following vectors:

| | |
|---|---|
| $\bar{n}_2 = (0 \ n_i^T \ 0 \ 0)^T$ | $\bar{v}_2 = (0 \ v_i^T \ 0 \ 0)^T$ |
| $\bar{n}_{31} = (-n_i^T \ 0 \ n_i^T \ 0)^T$ | $\bar{v}_{13} = (v_i^T \ 0 \ -v_i^T \ 0)^T$ |
| $\bar{n}_{42} = (0 \ -n_i^T \ 0 \ n_i^T)^T$ | $\bar{v}_{24} = (0 \ v_i^T \ 0 \ -v_i^T)^T$ |
| $\bar{r}_i = (0 \ \vec{r}_i^T \ 0 \ 0)^T$ | $\bar{t}_i = (0 \ \vec{t}_i^T \ 0 \ 0)^T$ |
| $\bar{r}_j = (0 \ 0 \ 0 \ \vec{r}_j^T)^T$ | $\bar{t}_j = (0 \ 0 \ 0 \ \vec{t}_j^T)^T$ |
| $\bar{f}_{ij} = (0 \ \vec{f}_{ij}^T \ 0 \ 0)^T$ | $\bar{e}_{ij} = (0 \ \vec{e}_{ij}^T \ 0 \ 0)^T$ |
| $\bar{c}_1 = -\rho_{j,n}\bar{t}_j + \tau_{j,n}\bar{r}_j$ | $\bar{d}_1 = -\rho_{j,v}\bar{t}_j + \tau_{j,v}\bar{r}_j$ |
| $\bar{c}_2 = \rho_{j,n}\bar{v}_2 - \rho_{j,v}\bar{n}_2$ | $\bar{d}_2 = \tau_{j,n}\bar{v}_2 - \tau_{j,v}\bar{n}_2$ |
| $\bar{c}_4 = \upsilon_n\bar{v}_2 - \upsilon_v\bar{n}_2$ | $\bar{d}_4 = \kappa_n\bar{v}_2 - \kappa_v\bar{n}_2$ |
| $\bar{c}_5 = \rho_{i,n}\bar{v}_2 - \rho_{i,v}\bar{n}_2$ | $\bar{d}_5 = \tau_{i,n}\bar{v}_2 - \tau_{i,v}\bar{n}_2.$ |

The low rank decomposition $\tilde{K}_{d2,u}$ becomes $$\tilde{K}_{d2,u} = \lambda(\bar{v}_{13}\bar{n}_2^T + \bar{n}_{31}\bar{v}_2^T + \bar{n}_2\bar{v}_{13}^T + \bar{v}_2\bar{n}_{31}^T) + \lambda\|s_j\|(\bar{n}_{42}\bar{d}_1^T + \bar{v}_{24}\bar{c}_1^T + \bar{r}_j\bar{d}_2^T - \bar{t}_j\bar{c}_2^T) + \lambda\|d_{ij}\|(\bar{f}_{ij}\bar{d}_4^T - \bar{e}_{ij}\bar{c}_4^T) - \lambda\|s_i\|(\bar{r}_i\bar{d}_5^T - \bar{t}_i\bar{c}_5^T).$$

Figure 12:
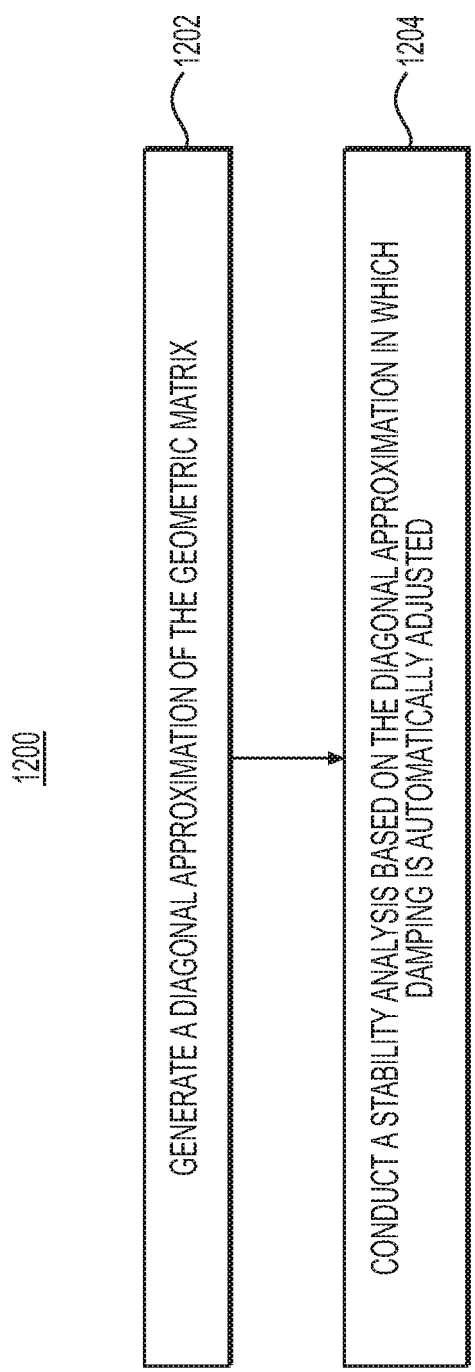
FIG. 12 is a diagram illustrating a flowchart illustrating a computer-implemented method implementing embodiments of the present technology.

Turning now to FIG. 12, a flowchart illustrating a computer-implemented method 1200 of executing a simulation of a constrained multi-body system is illustrated. In some embodiments, the computer-implemented method 1200 may be (completely or partially) implemented on a computing environment similar to the computing environment 100.

The method 1200 comprises using a physics engine simulating the constrained multi-body system. The constrained multi-body system comprises articulated constraints, the articulated constraints are associated with a geometric stiffness matrix. The geometric stiffness matrix defines a geometric stiffness. At a step 1202, the method 1200 executes generating a diagonal approximation of the geometric stiffness matrix. Then, at a step 1204, the diagonal approximation is used as part of a stability analysis in which damping is automatically adjusted so that the damping stabilizes the simulation of the constrained multi-body system.

In some embodiments, the damping is associated with a damping coefficient. The damping coefficient may be automatically adjusted so as to be large enough to stabilize transverse oscillations of the simulation of the constrained multi-body system. In some embodiments, the damping is an adaptive damping, the adaptive damping being associated with damping values calculated at each time step. The damping values may be calculated based on the following equation:

$$b = \frac{h^2 k - 4\alpha m}{2h}.$$

Wherein k is a stiffness, b is a damping and m is a mass, h is a given time step and a is a positive scalar value that allows control over how close dynamical system may be to the boundary before damping may be required.

In some embodiments, the simulation of the constrained multi-body system comprises a dynamical system wherein the geometric stiffness matrix is reinterpreted as a spring and the generated forces are used in combination with a stability criterion for stable simulation. The spring forces may define the damping.

In some embodiments, the stability criterion may comprise a threshold based on a behavior of a simple 1D undamped oscillator. The geometric stiffness matrix may serve as the stability criterion as to whether the dynamical system becomes unstable. In some embodiments, the geometric stiffness matrix is a $\tilde{K}$ matrix, wherein the $\tilde{K}$ matrix is defined as follows:

$$\tilde{K} = \frac{\partial J^T}{\partial x} \lambda.$$

Wherein J is a matrix of constraint Jacobians, $\lambda$ are constraint forces and x are positions and orientations of bodies in the simulation of the constrained multi-body system.

In some embodiments, the diagonal approximation of the geometric stiffness matrix may preserve mechanical work properties associated with the original geometric stiffness matrix. The geometric stiffness may define how forces in the constrained multi-body system change due to instantaneous motion.

In some embodiments, the instantaneous motion comprises at least one of rotation of links associated with the constrained multi-body system, translation of links associated with the constrained multi-body system and relative motion of links associated with the constrained multi-body system.

In some embodiments, a topology of a mechanical structure of the constrained multi-body system may remain unmodified during the simulating of the constrained multi-body system. In some embodiments, the parameters of the damping define an interpretation of the geometric stiffness used in the simulation of the constrained multi-body system. In some embodiments, at least one of the parameters define physical behaviour of a transient physical spring that is able to generate forces in directions transverse to transverse oscillations directions. In some embodiments, the simulating of the constrained multi-body system may be executed in real-time.

In some embodiments, stabilizing the simulation of the constrained multi-body system may comprise stabilizing the transverse oscillations of the simulation of the constrained multi-body system.

In some embodiments, the geometric stiffness matrix may be generated by using a low rank update algorithm, the using of the low rank update algorithm comprising constructing a lead matrix of dynamical equations of motion, the lead matrix comprising the geometric stiffness matrix. The geometric stiffness matrix may model the articulated constraints. In some embodiments, data encoding parameters of the transient spring models a tensor encoding variations in constraint force directions.

As it may be appreciated, a constrained multi-body system may comprise rigid bodies such as the ones illustrated in FIG. 2-11. In some embodiments, a rigid body may be defined as an idealization of a solid body in which deformation is neglected. In other words, a distance between any two given points of a rigid body may remain constant in time regardless of external forces exerted on it. In a constrained multi-body system simulation, constraints may specify how the rigid bodies are allowed to move relative to one another.

As it may be appreciated, a physics engine may compute motions of rigid bodies based on dynamic equations, typically subject to gravity and possibly connected using kinematic constraints also referred to as joints, such as, but not limited to, a hinge or slider constraint. Examples of physics engine may include, but is not limited to, Bullet, Open Dynamics Engine (ODE), Havok, Simmechanics™ from Matlab and Vortex™ from CM Labs.

As it may be appreciated, an articulated constraint may consist of a constraint function defining allowed relative motion between rigid bodies. A derivative of the constraint may be a Jacobian matrix. The derivative of the Jacobian w.r.t. position may be the geometric stiffness matrix in accordance with the present technology.

In some embodiments, forces described by the geometric stiffness may be considered as forces generated by a set of springs in relevant dimensions. Dynamical equations of motion may be rewritten in such a way as to match equations of a spring, thus providing stiffness and damping coefficient of such a spring.

In some embodiments, stability may depend on multiple factors such as mass, stiffness, damping, the time step, and the integration scheme. The stability analysis may assume that a system is linear and may use standard methods to determine a boundary of stability. The stability analysis may be based on the fact that if the magnitude of the Eigen values of the phase space matrix are <1 (for an example of such a matrix, see "P" from equation (8)). We may do this for a simple harmonic oscillator, and for such a simple system the stability may be guaranteed if this condition holds. The present technology may also be applied to more complex systems using an approximation of the geometric stiffness thereby enlarging the region stability.

In some embodiments, the stiffness matrix may be diagonalized to increase performance of the updated mass matrix computation and facilitate convergence analysis. In some embodiment, the implicit damping matrix may be then computed using equation (13).

In some embodiments, "damping", "adaptive damping" and "adaptive damping scheme" may refer to a method for varying an amount of damping in a damper according to some criterion. In some embodiments, an amount of damping may be different for each degree of freedom and may depend on an amount of tension in system in that degree of freedom, and be only as high as necessary to maintain stability. In some embodiments, the method for varying an amount of damping may mitigate non-constitutive energy dissipation.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A computer-implemented method for executing a simulation of a constrained multi-body system, the method comprising:
   simulating the constrained multi-body system by using a physics engine, the constrained multi-body system comprising articulated constraints;
   associating the articulated constraints with a geometric stiffness matrix; the geometric stiffness matrix defining a geometric stiffness, wherein the geometric stiffness defines how a direction of forces in the constrained multi-body system changes due to instantaneous motion of one or more links associated with the constrained multi-body system; and
   using the geometric stiffness matrix as part of a stability analysis in order to determine damping values, the damping values being calculated at each time step of the simulation, the damping values being determined so as to achieve stability of the simulation of the constrained multi-body system.

2. The method of claim 1, wherein determining the damping values is based on a damping coefficient.

3. The method of claim 2, wherein the damping coefficient is automatically adjusted so as to be large enough to stabilize transverse oscillations of the simulation of the constrained multi-body system.

4. The method of claim 1, wherein the simulation of the constrained multi-body system comprises a dynamical system wherein the geometric stiffness matrix is reinterpreted as a spring and the generated forces are used in combination with a stability criterion for stable simulation.

5. The method of claim 4, wherein spring forces define the damping.

6. The method of claim 4, wherein the stability criterion comprises a threshold based on a behavior of a simple 1D undamped oscillator.

7. The method of claim 6, wherein the geometric stiffness matrix serves as the stability criterion as to whether the dynamical system becomes unstable.

8. The method of claim 7, wherein the geometric stiffness matrix is a $\tilde{K}$ matrix, wherein the $\tilde{K}$ matrix is defined as follows:

$$\tilde{K} = \frac{\partial J^T}{\partial x} \lambda$$

wherein J is a matrix of constraint Jacobians, $\lambda$ are constraint forces and x are positions and orientations of bodies in the simulation of the constrained multi-body system.

9. The method of claim 1, wherein the instantaneous motion comprises at least one of rotation of the one or more links associated with the constrained multi-body system, translation of the one or more links associated with the constrained multi-body system and relative motion of the one or more links associated with the constrained multi-body system.

10. The method of claim 1, wherein a topology of a mechanical structure of the constrained multi-body system remains unmodified during the simulating of the constrained multi-body system.

11. The method of claim 1, wherein the damping values comprise parameters which define an interpretation of the geometric stiffness used in the simulation of the constrained multi-body system.

12. The method of claim 11, wherein at least one of the parameters define physical behaviour of a transient physical spring that is able to generate forces in directions transverse to transverse oscillations directions.

13. The method of claim 12, wherein data encoding parameters of the transient spring models a tensor encoding variations in constraint force directions.

14. The method of claim 1, wherein the simulating of the constrained multi-body system is executed in real-time.

15. The method of claim 1, wherein stabilizing the simulation of the constrained multi-body system comprises stabilizing the transverse oscillations of the simulation of the constrained multi-body system.

16. The method of claim 1, wherein the geometric stiffness matrix is generated by using a low rank update algorithm, the using of the low rank update algorithm comprising constructing a lead matrix of dynamical equations of motion, the lead matrix comprising the geometric stiffness matrix.

17. The method of claim 1, wherein the geometric stiffness matrix models the articulated constraints.

18. The method of claim 1, wherein using the geometric stiffness matrix comprises generating a diagonal approximation of the geometric stiffness matrix.

19. The method of claim 18, wherein the diagonal approximation of the geometric stiffness is calculated in accordance with the following equation:

$$b = \frac{h^2 k - 4\alpha m}{2h}$$

wherein k is a stiffness, b is a damping and m is a mass, h is a given time step and a is a positive scalar value that allows control over how close dynamical system may be to the boundary before damping may be required.

20. The method of claim 18, wherein the diagonal approximation of the geometric stiffness matrix preserves mechanical work properties associated with the constrained multi-body system.

21. A computer-implemented system for executing a simulation of a constrained multi-body system, the system comprising:
   a processor;
   a non-transitory computer-readable medium, the non-transitory computer-readable medium comprising control logic which, upon execution by the processor, causes:

simulating the constrained multi-body system by using a physics engine, the constrained multi-body system comprising articulated constraints;

associating the articulated constraints with a geometric stiffness matrix; the geometric stiffness matrix defining a geometric stiffness, wherein the geometric stiffness defines how a direction of forces in the constrained multi-body system changes due to instantaneous motion of one or more links associated with the constrained multi-body system; and using the geometric stiffness matrix as part of a stability analysis in order to determine damping values, the damping values being calculated at each time step of the simulation, the damping values being determined so as to achieve stability of the simulation of the constrained multi-body system.

22. A non-transitory computer-readable medium, the non-transitory computer-readable medium comprising control logic which, upon execution by a processor, causes:

simulating the constrained multi-body system by using a physics engine, the constrained multi-body system comprising articulated constraints;

associating the articulated constraints with a geometric stiffness matrix; the geometric stiffness matrix defining a geometric stiffness, wherein the geometric stiffness defines how a direction of forces in the constrained multi-body system changes due to instantaneous motion of one or more links associated with the constrained multi-body system; and using the geometric stiffness matrix as part of a stability analysis in order to determine damping values, the damping values being calculated at each time step of the simulation, the damping values being determined so as to achieve stability of the simulation of the constrained multi-body system.

\* \* \* \* \*

UNITED STATES PATENT AND TRADEMARK OFFICE
CERTIFICATE OF CORRECTION

PATENT NO. : 10,713,400 B2  
APPLICATION NO. : 15/959819  
DATED : July 14, 2020  
INVENTOR(S) : Sheldon Paul Andrews et al.

Page 1 of 1

It is certified that error appears in the above-identified patent and that said Letters Patent is hereby corrected as shown below:

In the Claims

Claim 12, Column 26, Lines 19-21, "The method of claim 11, wherein at least one of the parameters define physical behaviour of a transient physical spring" should read -- The method of claim 11, wherein at least one of the parameters defines physical behaviour of a transient physical spring --

Claim 19, Column 26, Lines 52-53, "wherein k is a stiffness, b is a damping and m is a mass, h is a given time step and a is a positive scalar value" should read -- wherein k is a stiffness, b is a damping and m is a mass, h is a given time step and α is a positive scalar value --

Signed and Sealed this  
Third Day of November, 2020

Andrei Iancu  
*Director of the United States Patent and Trademark Office*